US012787523B2

(12) United States Patent
Lopez-Julia et al.

(10) Patent No.: US 12,787,523 B2
(45) Date of Patent: Nov. 3, 2026

(54) LED ARRAY WITH CONTINUOUS SEMICONDUCTOR LAYER

(71) Applicant: Lumileds LLC, San Jose, CA (US)

(72) Inventors: Antonio Lopez-Julia, Vaals (NL); Erik Young, San Jose, CA (US)

(73) Assignee: LUMILEDS LLC, San Jose, CA (US)

( * ) Notice: Subject to any disclaimer, the term of this patent is extended or adjusted under 35 U.S.C. 154(b) by 314 days.

(21) Appl. No.: 18/526,966

(22) Filed: Dec. 1, 2023

(65) Prior Publication Data

US 2025/0185429 A1 Jun. 5, 2025

(51) Int. Cl.

| | |
|---|---|
| ***H10H 20/857*** | (2025.01) |
| ***H10H 20/01*** | (2025.01) |
| ***H10H 20/824*** | (2025.01) |
| ***H10H 20/851*** | (2025.01) |
| ***H10H 29/14*** | (2025.01) |
| ***H10W 90/00*** | (2026.01) |

(52) U.S. Cl.

CPC ...... *H10H 20/857* (2025.01); *H10H 20/0133* (2025.01); *H10H 20/824* (2025.01); *H10H 20/8514* (2025.01); *H10H 29/142* (2025.01); *H10W 90/00* (2026.01); *H10H 20/0364* (2025.01)

(58) Field of Classification Search

CPC ............. H10H 20/857; H10H 20/0133; H10H 20/824; H10H 20/8514; H10H 29/142; H10H 20/0364; H10H 29/012; H10H 29/011; H10H 29/8321; H10H 29/30; H10H 29/8323; H10H 29/842; H10H 29/14; H10W 90/00

See application file for complete search history.

(56) References Cited

U.S. PATENT DOCUMENTS

| | | | | |
|---|---|---|---|---|
| 2007/0007584 A1 | 1/2007 | Hwang et al. | | |
| 2011/0156616 A1* | 6/2011 | Anderson | ............ | H10H 29/142 315/312 |
| 2020/0235085 A1* | 7/2020 | Tao | ....................... | H10W 90/00 |
| 2022/0013511 A1 | 1/2022 | Kishimoto | | |
| 2022/0173159 A1 | 6/2022 | Lutgen et al. | | |

(Continued)

FOREIGN PATENT DOCUMENTS

CN 219842991 U 10/2023

OTHER PUBLICATIONS

From the EPO as the ISA, "Notification of Transmittal of the International Search Report and the Written Opinion of the International Searching Authority, or the Declaration", PCT/US2024/053628, Jan. 30, 2025, 9 pages.

*Primary Examiner* — Marlon T Fletcher
*Assistant Examiner* — Christina A Sylvia

(57) ABSTRACT

An n-doped semiconductor layer spans multiple LEDs of an array, in some cases the entire array. Corresponding p-contacts are localized on the p-doped semiconductor layer of each LED to only a central region of that LED and are electrically isolated from the p-contacts of adjacent LEDs. Corresponding n-contacts (i) are localized to only peripheral regions of the corresponding LEDs, (ii) extend through the p-doped layers and the active regions of adjacent LEDs to make contact with the continuous n-doped layer, and (iii) are electrically isolated from those p-doped layers and active regions. In some cases the nonzero combined thickness of the n-doped layer, p-doped layer, and the active region can be less than 5 μm.

18 Claims, 16 Drawing Sheets

(56) References Cited

U.S. PATENT DOCUMENTS

| | | | |
|---|---|---|---|
| 2022/0190024 | A1 | 6/2022 | Armitage et al. |
| 2023/0282631 | A1 | 9/2023 | Jeong et al. |
| 2024/0313037 | A1 | 9/2024 | Li et al. |

* cited by examiner

LED ARRAY WITH CONTINUOUS SEMICONDUCTOR LAYER

FIELD OF THE INVENTION

The invention relates generally to light-emitting diodes and to phosphor-converted light-emitting diodes.

BACKGROUND

Semiconductor light-emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

In some instances the light directly emitted by the LEDs can comprise their output; such LEDs can be referred to as direct emitters, or direct-emitting LEDs. In some instances the LEDs can be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer. Hereinafter the term LED shall denote either or both direct-emitting LEDs and/or phosphor-converted LEDs, unless one or the other is explicitly or implicitly specified.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

Multiple LEDs (direct-emitting and/or phosphor converted) can be formed together on a single substrate to form an array. Such arrays can be employed to form active illuminated displays, such as those employed in, e.g., smartphones and smart watches, computer or video displays, augmented- or virtual-reality displays (i.e., visualization systems), or signage, or to form adaptive illumination sources, such as those employed in, e.g., automotive headlights, street lighting, camera flash sources, or flashlights (i.e., torches). An array having one or several or many individual devices per millimeter (e.g., device pitch or spacing of about a millimeter, a few hundred microns, or less than 100 microns, and/or separation between adjacent devices less than 100 microns or only a few tens of microns or less) typically is referred to as a miniLED array or a microLED array (alternatively, a μLED array). Such mini- or microLED arrays that include phosphor-converted LEDs can be referred to as pc-miniLED or pc-microLED arrays.

SUMMARY

An inventive light-emitting device comprises an array of multiple semiconductor light-emitting diodes (LEDs). Each of the LEDs includes a corresponding n-doped semiconductor layer, a corresponding p-doped semiconductor layer, a corresponding active region therebetween, one or more corresponding electrically conductive n-contacts in electrical contact with the n-doped layer, and one or more electrically conductive p-contacts in electrical contact with the p-doped layer. The active region is arranged for emitting light at a corresponding LED wavelength as a result of radiative recombination of charge carriers at the active region. For at least a subset of two or more LEDs of the array, the corresponding n-doped layers of the LEDs of the subset forming a continuous n-doped layer span the LEDs of the subset; in some instances the continuous n-doped layer can span the entire array of LEDs (i.e., the subset can include all LEDs of the array). For each of the LEDs of the subset, the corresponding one or more p-contacts are localized on the corresponding p-doped layer to only a central region of that LED, and are electrically isolated from the p-contacts of adjacent LEDs of the subset. For each of the LEDs of the subset, the corresponding one or more n-contacts (i) are localized to only peripheral regions of the corresponding LEDs, (ii) extend through the p-doped layers and the active regions of adjacent LEDs of the subset to make contact with the continuous n-doped layer, and (iii) are electrically isolated from those p-doped layers and active regions. In some examples the nonzero combined thickness of the n-doped layer, p-doped layer, and the active region can be less than 5 μm. In some examples, the n- and p-doped layers can be interchanged, and the n- and p-contacts can be interchanged.

Objects and advantages pertaining to LEDs, pcLEDs, miniLED arrays, pc-miniLED arrays, microLED arrays, and pc-microLED arrays may become apparent upon referring to the examples illustrated in the drawings and disclosed in the following written description or appended claims.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The examples depicted are shown only schematically; all features may not be shown in full detail or in proper proportion; for clarity certain features or structures may be exaggerated or diminished relative to others or omitted entirely; the drawings should not be regarded as being to scale unless explicitly indicated as being to scale. For example, individual LEDs may be exaggerated in their vertical dimensions or layer thicknesses relative to their lateral extent or relative to substrate or phosphor thicknesses. Some schematic illustrations of example structures of various devices and assemblies described herein may be shown with precise right angles and straight lines, but it is to be understood that such schematic illustrations may not reflect real-world process limitations or defects. Such process limitations or defects can cause the features to look not so "ideal" when any of the structures described herein are examined using, e.g., scanning electron microscopy (SEM) images or transmission electron microscope (TEM) images. In such images of real structures, possible processing limitations or defects might be visible, e.g., not-perfectly straight edges of materials, tapered vias or other openings, inadvertent rounding of corners or variations in thicknesses of different material layers. There may be other limitations or defects not listed here that can occur within the field of device fabrication. Such defects notwithstanding, such real-world devices shall nevertheless fall within the scope of the present disclosure or appended claims. The examples shown should not be construed as limiting the scope of the present disclosure or appended claims.

DETAILED DESCRIPTION

The following detailed description should be read with reference to the drawings, in which identical reference numbers refer to like elements throughout the different figures. The drawings, which are not necessarily to scale, depict selective examples and are not intended to limit the scope of the inventive subject matter. The detailed description illustrates by way of example, not by way of limitation, the principles of the inventive subject matter. For purposes of simplicity and clarity, detailed descriptions of well-known devices, circuits, and methods may be omitted so as not to obscure the description of the inventive subject matter with unnecessary detail.

Figure 1A:
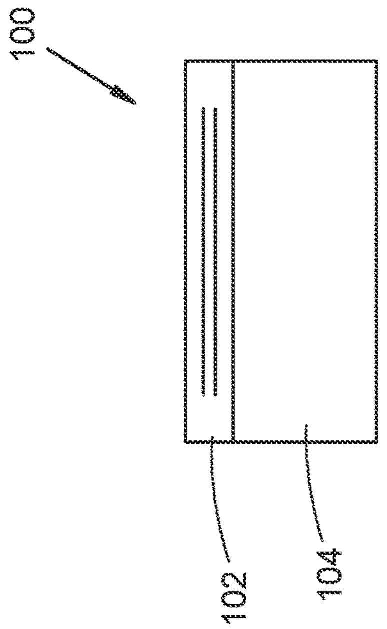
FIG. 1A shows a schematic cross-sectional view of an example direct-emitting LED.
Figure 1B:
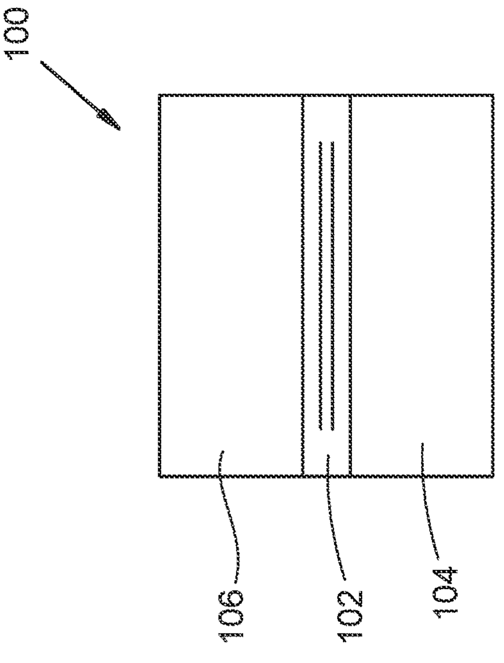
FIG. 1B shows a schematic cross-sectional view of an example phosphor-converted LED.

FIG. 1A shows an example of an individual direct-emitting LED 100 comprising a semiconductor diode structure 102 disposed on a substrate 104. FIG. 1B shows an example of an individual phosphor-converted LED 100 comprising a semiconductor diode structure 102 disposed on a substrate 104 and a wavelength converting structure (e.g., phosphor layer) 106 disposed on the semiconductor LED. Semiconductor diode structure 102 typically comprises an active region disposed between n-type and p-type layers; examples of an active region can include a junction between the n- and p-type layers, or one or more active layers between the n- and p-type layers (e.g., quantum well, multi-quantum well, quantum dots, and so forth). Application of a suitable forward bias across the diode structure 102 results in radiative recombination of charge carriers at the active region and concomitant emission of light from the active region. The wavelength of the emitted light is determined by the composition and structure of the active region.

The LED may be, for example, a III-Nitride LED that emits red, green, blue, violet, or ultraviolet light. LEDs formed from any other suitable material system and that emit any other suitable wavelength of light may also be used. Other suitable material systems may include, for example, III-Phosphide materials, III-Arsenide materials, other binary, ternary, or quaternary alloys of gallium, aluminum, indium, nitrogen, phosphorus, or arsenic, or II-VI materials.

Any suitable phosphor materials may be used for or incorporated into the wavelength converting structure 106, depending on the desired optical output from the pcLED.

Figure 2A:
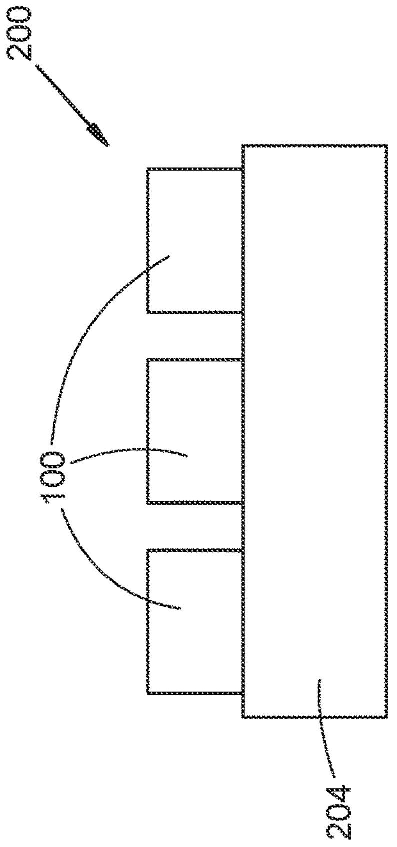
FIGS. 2A and 2B show, respectively, cross-sectional and top schematic views of an example array of LEDs (direct-emitting or phosphor converted).
Figure 2B:
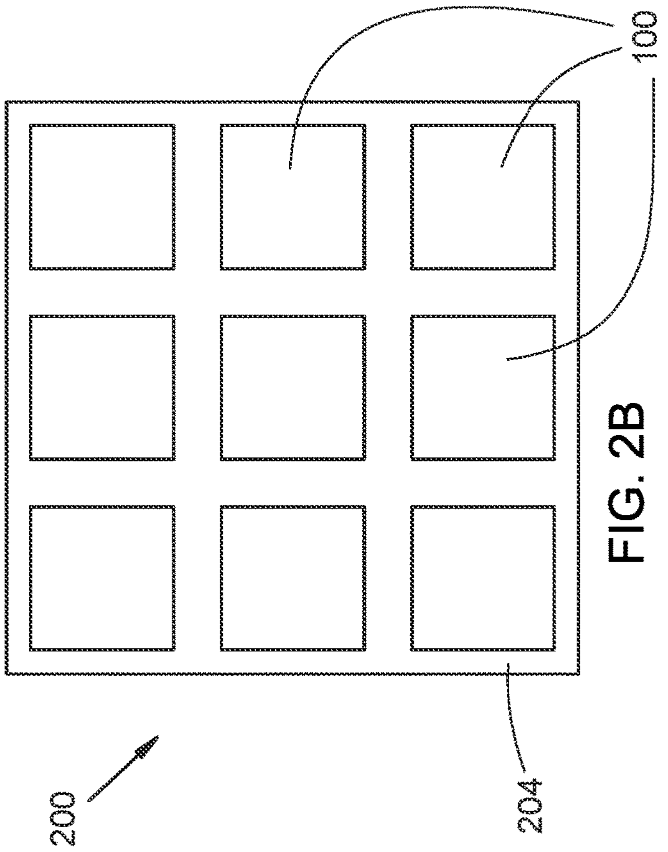

FIGS. 2A-2B show, respectively, cross-sectional and top views of an array 200 of LEDs 100 (direct-emitting or phosphor-converted) disposed on a substrate 204. Such an array can include any suitable number of LEDs arranged in any suitable manner. In the illustrated example the array is depicted as formed monolithically on a shared substrate, but alternatively an array of LEDs can be formed from separate individual LEDs (e.g., singulated devices that are assembled onto an array substrate). In an array of pcLEDS, individual phosphor pixels 106 can be positioned on each semiconductor diode pixel 102; alternatively, a continuous layer of phosphor material can be disposed across multiple semiconductor diodes 102. In some instances the array 200 can include light barriers (e.g., reflective, scattering, and/or absorbing) between adjacent semiconductor diodes 102, phosphor pixels 106 (if present), or both. Substrate 204 may optionally include electrical traces or interconnects, or CMOS or other circuitry for driving the LEDs, and may be formed from any suitable materials.

Figure 3A:
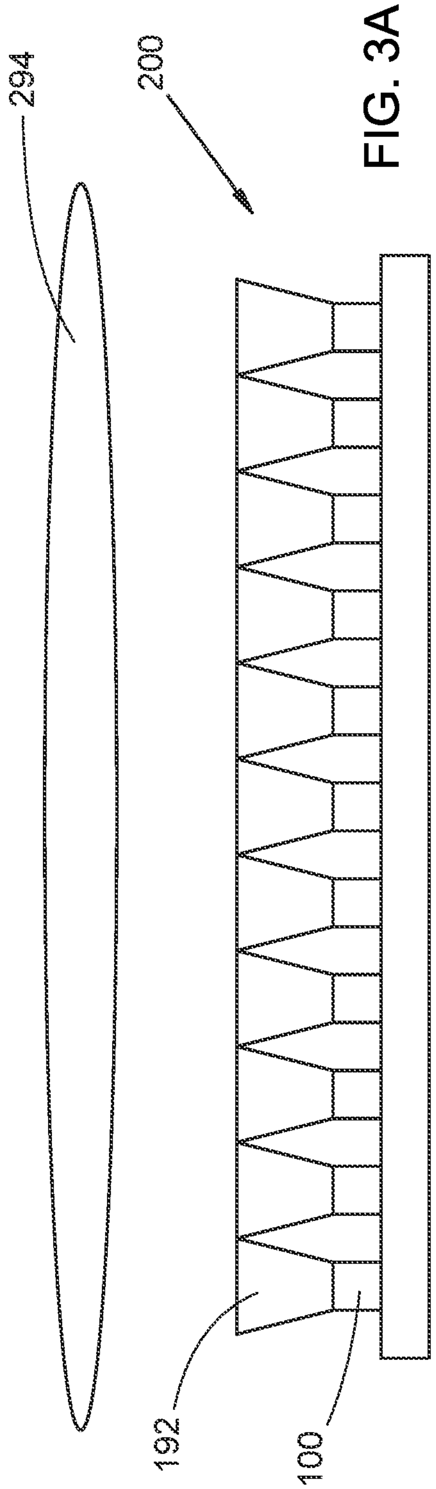
FIG. 3A shows a schematic cross-sectional view of an example array of LEDs (direct-emitting or phosphor-converted) arranged with respect to waveguides and a projection lens.
Figure 3B:
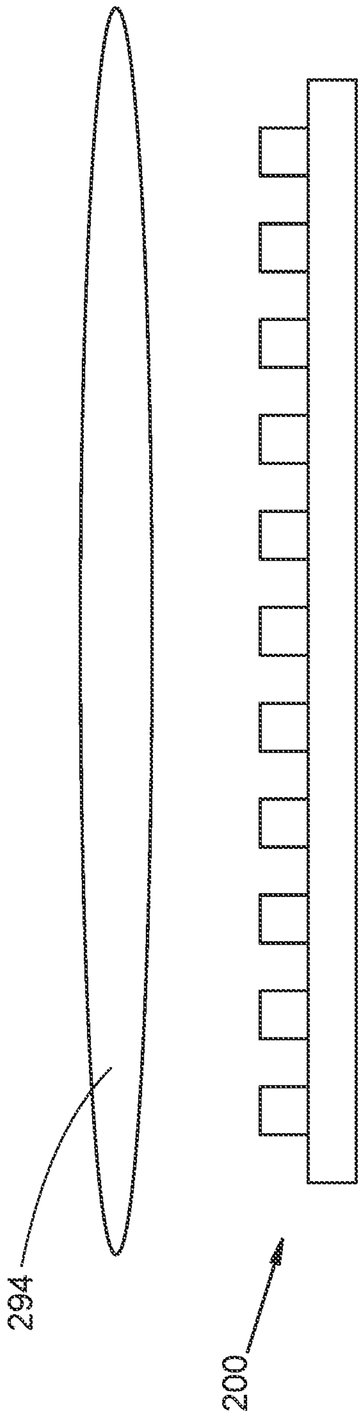
FIG. 3B schematically illustrates an arrangement similar to that of FIG. 3A, but without the waveguides.

Individual LEDs 100 may optionally incorporate or be arranged in combination with a lens or other optical element located adjacent to or disposed on the semiconductor diode or phosphor layer (if present). Such an optical element, not shown in the figures, may be referred to as a "primary optical element". In addition, as shown in FIGS. 3A and 3B, an LED array 200 (for example, mounted on an electronics board) may be arranged in combination with secondary optical elements such as waveguides, lenses, or both for use in an intended application. In FIG. 3A, light emitted by each LED 100 of the array 200 is collected by a corresponding waveguide 192 and directed to a projection lens 294. Projection lens 294 may be a Fresnel lens, for example. This arrangement may be suitable for use, for example, in automobile headlights or other adaptive illumination sources. Other primary or secondary optical elements of any suitable type or arrangement can be included for each pixel, as needed or desired. In FIG. 3B, light emitted by LEDs of the array 200 is collected directly by projection lens 294 without use of intervening waveguides. This arrangement may particularly be suitable when LEDs can be spaced sufficiently close to each other, and may also be used in automobile headlights as well as in camera flash applications or other illumination sources. A miniLED or microLED display application may use similar optical arrangements to those depicted in FIGS. 3A and 3B, for example. Generally, any suitable arrangement of optical elements (primary, secondary, or both) can be used in combination with the LEDs described herein, depending on the desired application.

Figure 4A:
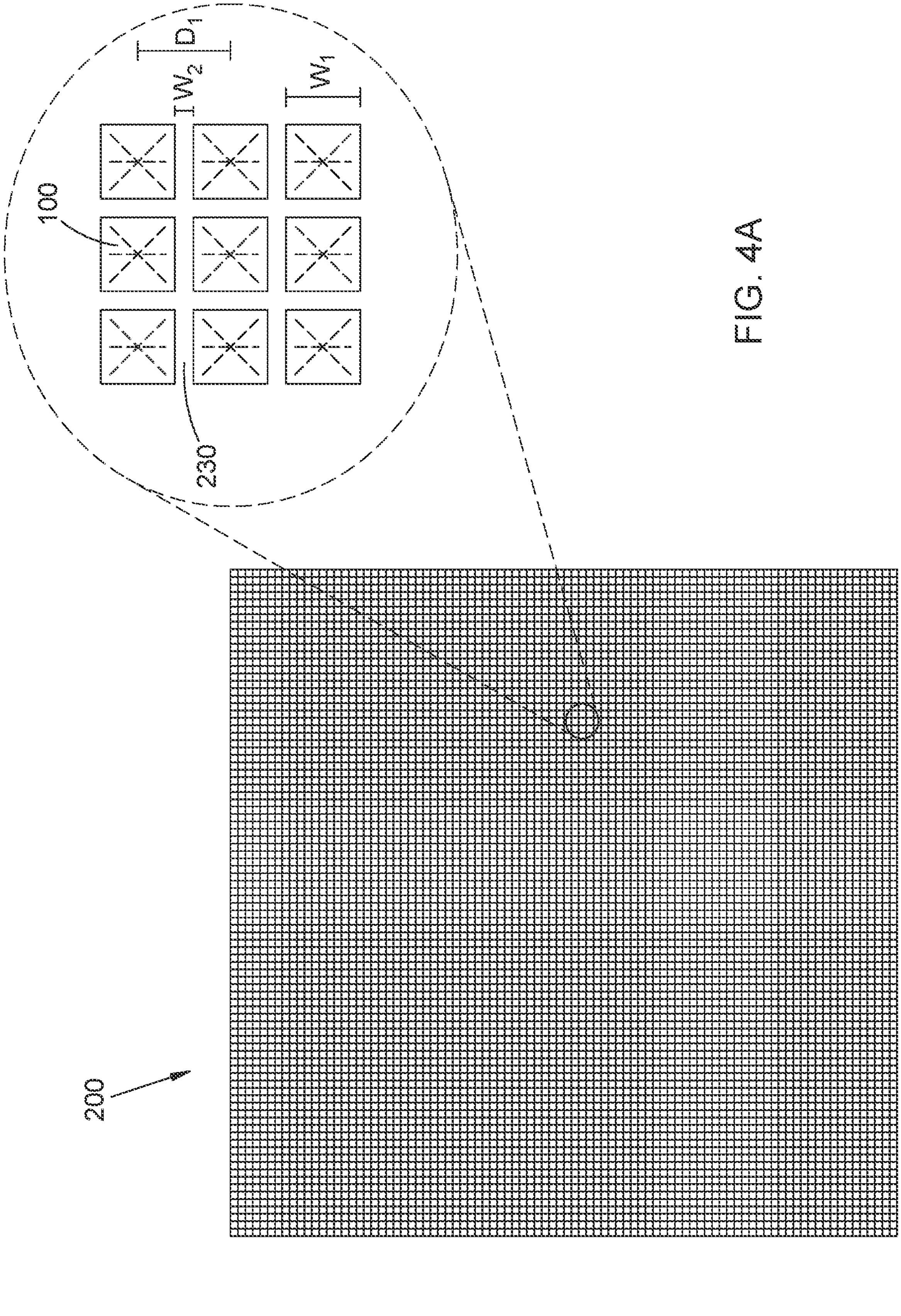
FIG. 4A shows a schematic top view of an example miniLED or microLED array (direct-emitting or phosphor converted) and an enlarged section of 3×3 LEDs of the array.

Although FIGS. 2A and 2B show a 3×3 array of nine LEDs, such arrays may include for example on the order of $10^1$, $10^2$, $10^3$, $10^4$, or more LEDs, e.g., as illustrated schematically in FIG. 4A. Individual LEDs 100 (i.e., pixels) may have widths $w_1$ (e.g., side lengths) in the plane of the array 200, for example, less than or equal to 1 millimeter (mm), less than or equal to 500 microns, less than or equal to 100 microns, or less than or equal to 50 microns. LEDs 100 in the array 200 may be spaced apart from each other by streets, lanes, or trenches 230 having a width $w_2$ in the plane of the array 200 of, for example, hundreds of microns, less than or equal to 100 microns, less than or equal to 50 microns, less than or equal to 20 microns, less than or equal to 10 microns, or less than or equal to 5 microns. The pixel pitch or spacing Di is the sum of $w_1$ and $w_2$. Although the illustrated examples show rectangular pixels arranged in a symmetric matrix, the pixels and the array may have any suitable shape or arrangement, whether symmetric or asymmetric. Multiple separate arrays of LEDs can be combined in any suitable arrangement in any applicable format to form a larger combined array or display.

LEDs having dimensions $w_1$ in the plane of the array (e.g., side lengths) of less than or equal to about 0.10 millimeters microns are typically referred to as microLEDs, and an array of such microLEDs may be referred to as a microLED array. LEDs having dimensions $w_1$ in the plane of the array (e.g., side lengths) of between about 0.10 millimeters and about 1.0 millimeters are typically referred to as miniLEDs, and an array of such miniLEDs may be referred to as a miniLED array.

Figure 4B:
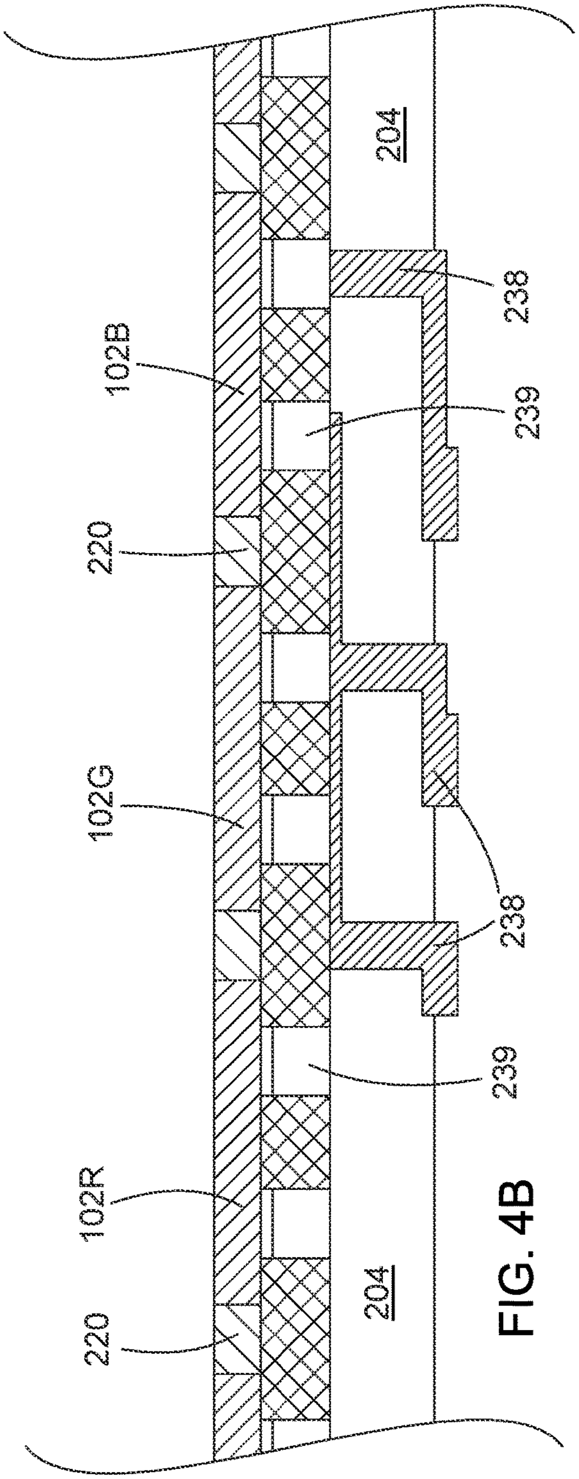
FIG. 4B is a side cross-sectional schematic diagram of an example of a close-packed array of multi-colored, direct-emitting LEDS on a monolithic die and substrate.
Figure 4C:
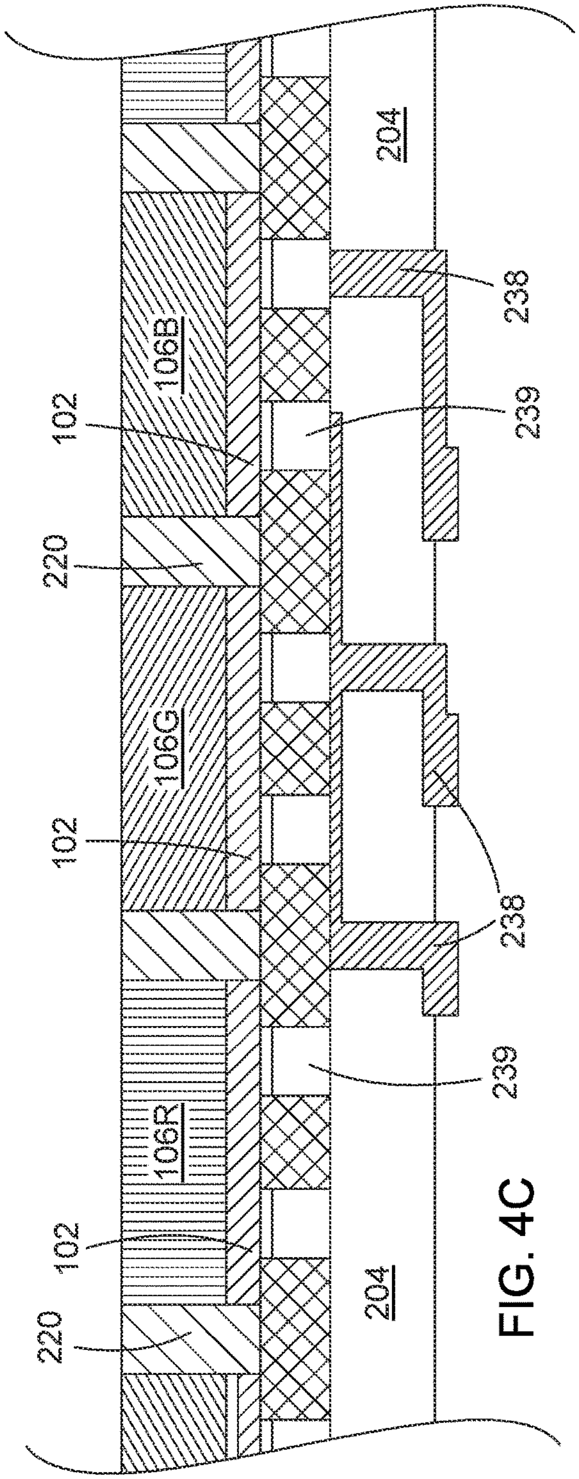
FIG. 4C is a side cross-sectional schematic diagram of an example of a close-packed array of multi-colored, phosphor-converted LEDS on a monolithic die and substrate.

FIG. 4B is a schematic cross-sectional view of a close packed array 200 of multi-colored, direct-emitting semiconductor diodes 102R/102G/102B (e.g., red/green/blue) on a monolithic die and substrate 204 (e.g., arranged as an electronic backplane), with the semiconductor diodes 102R/102G/102B attached to the substrate 204 through metal interconnects 239 (e.g., gold-gold interconnects or solder attached to copper micropillars) and metal interconnects 238. FIG. 4C is a schematic cross-sectional view of a close packed array 200 of multi-colored, phosphor-converted LEDs on a monolithic die and substrate 204 (e.g., arranged as an electronic backplane), with semiconductor diodes 102 attached to the substrate 204 through metal interconnects 239 (e.g., gold-gold interconnects or solder attached to copper micropillars) and metal interconnects 238. Phosphor pixels 106R/106G/106B (e.g., red/green/blue) are positioned on or over corresponding LED pixels 102. The semiconductor diode pixels 102R/102G/102B (FIG. 4B), or the semiconductor diode pixels 102 or phosphor pixels 106 or both (FIG. 4C), can be coated on their sides with a reflective mirror or diffusive scattering layer to form an optical isolation barrier 220. The arrangements of FIG. 4B or 4C can enable use of the LED array 200 as, e.g., a color display.

The individual LEDs (pixels) in an LED array may be individually addressable (i.e., selectively operable), may be addressable as part of a group or subset of the pixels in the array, or may not be addressable. Thus, light-emitting pixel arrays are useful for any application requiring or benefiting from fine-grained intensity, spatial, and temporal control of light distribution. These applications may include, but are not limited to, precise special patterning of emitted light from pixel blocks or individual pixels, in some instances including the formation of images as a display device. Depending on the application, emitted light may be spectrally distinct, adaptive over time, and/or environmentally responsive. The light-emitting pixel arrays may provide preprogrammed light distribution in various intensity, spatial, or temporal patterns. The emitted light may be based at least in part on received sensor data and may be used for optical wireless communications. Associated electronics and optics may be distinct at a pixel, pixel block, or device level.

Figure 5A:
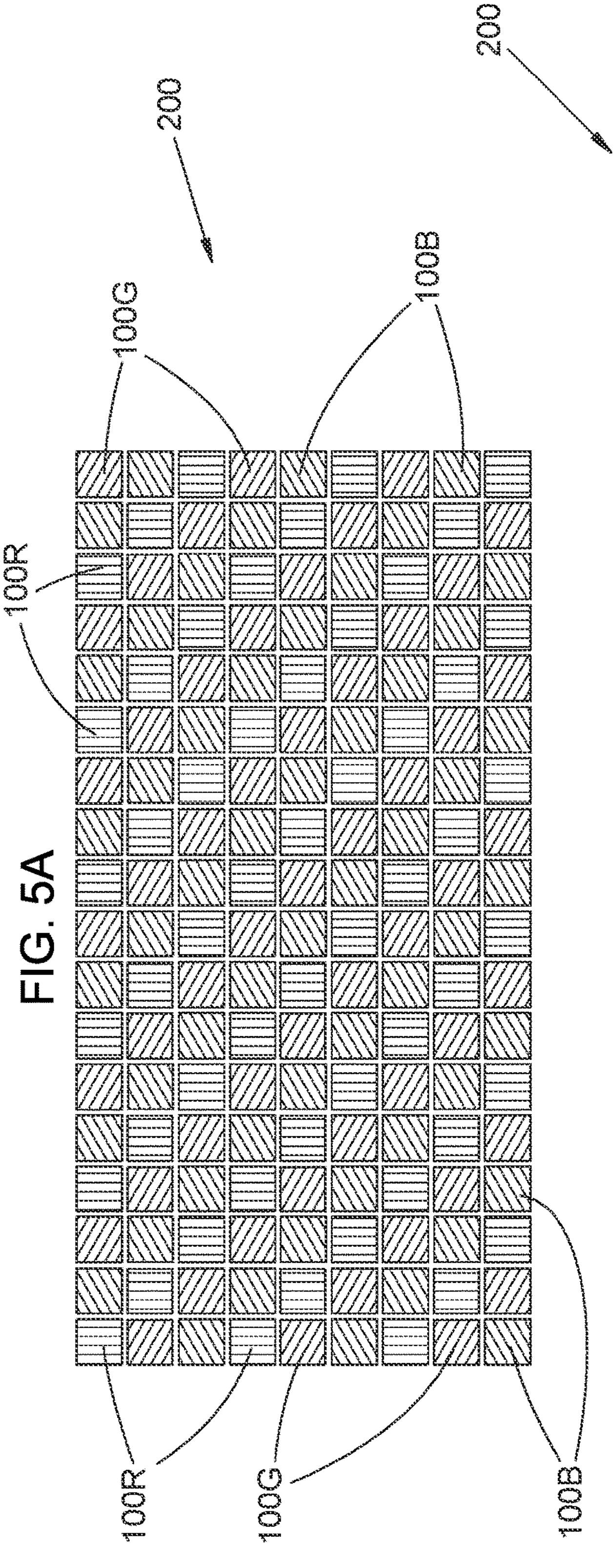
FIG. 5A is a schematic top view of a portion of an example LED display in which each display pixel is a red, green, or blue LED pixel (direct-emitting or phosphor-converted)
Figure 5B:
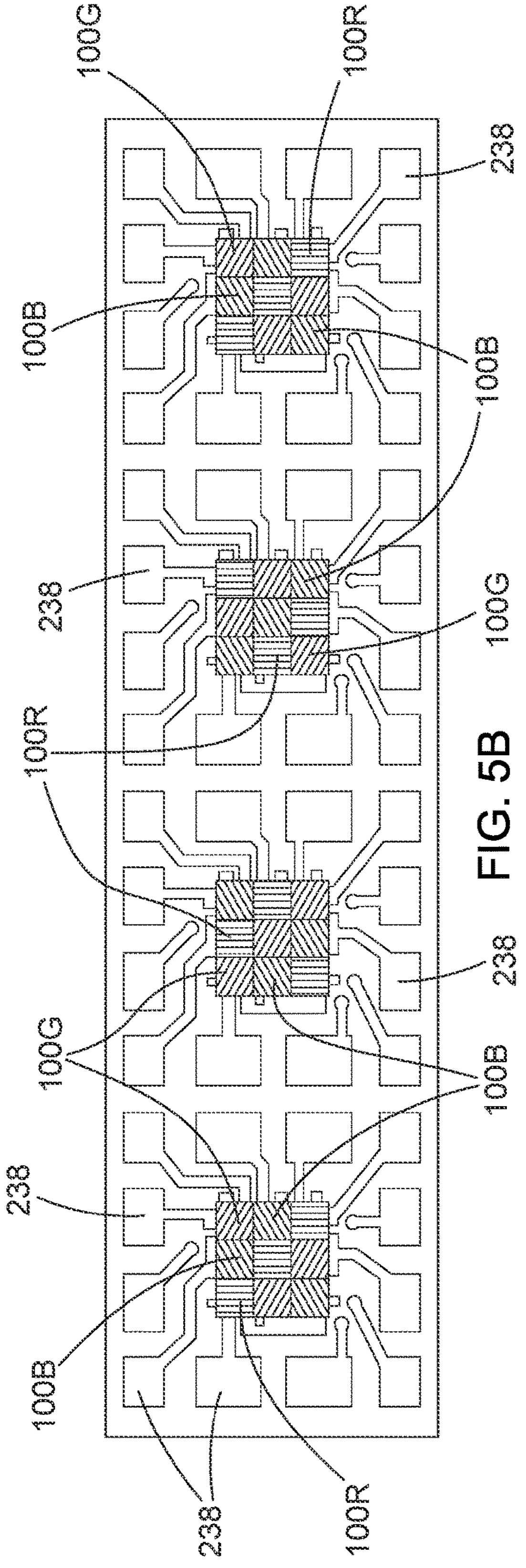
FIG. 5B is a schematic top view of a portion of an example LED display in which each display pixel includes multiple LED sub-pixels (red, green, and blue; direct-emitting or phosphor-converted) integrated onto a single die that is bonded to a control circuit backplane.

FIGS. 5A and 5B are examples of LED arrays 200 employed in display applications, wherein an LED display includes a multitude of display pixels. In some examples (e.g., as in FIG. 5A), each display pixel comprises a single semiconductor LED pixel 100R, 100G, or 100B of a single color (red, green, or blue; direct-emitting or phosphor-converted). Each display pixel only provides one of the three colors. In some examples (e.g., as in FIG. 5B, in which the LEDs are mounted on a circuit board or electronic backplane), each display pixel includes multiple corresponding LED sub-pixels 100 of multiple colors (direct-emitting or phosphor-converted). In the example shown each display pixel includes a 3×3 array of LED sub-pixels 100; three of those are red LEDs 102R, three are green LEDs 100G, and three are blue LEDs 100B. Each display pixel can therefore produce many desired color combinations. In the example shown the spatial arrangement of the different colored LED sub-pixels 100 differs among the display pixels; in some examples (not shown) each display pixel can have the same arrangement of the different colored LED sub-pixels 100.

Figure 6B:
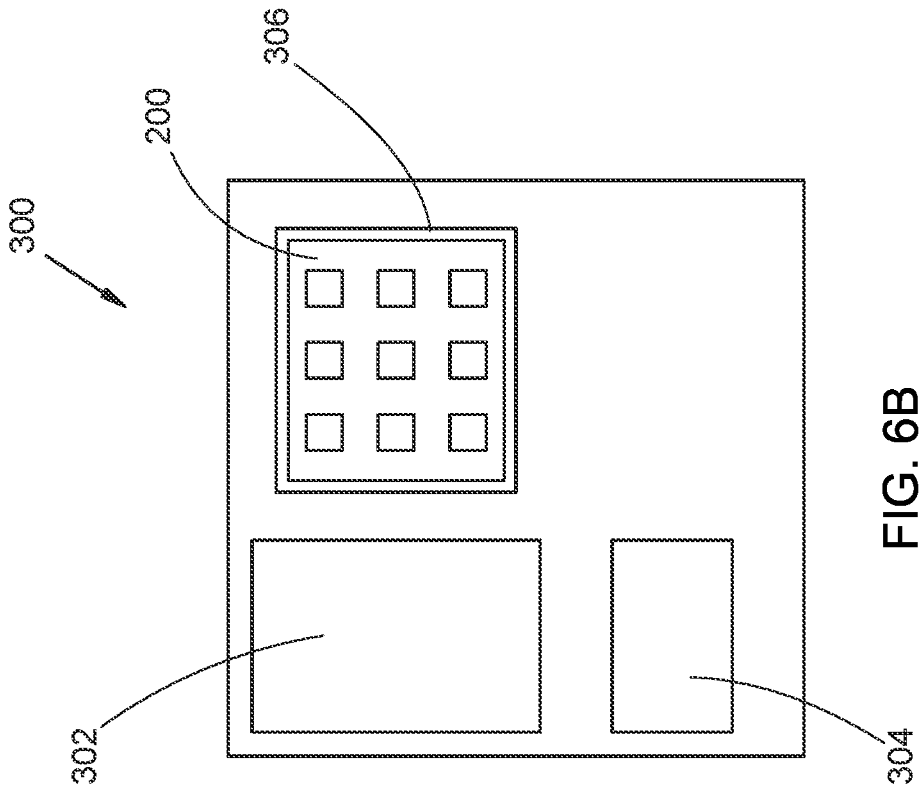
FIG. 6B shows a schematic top view of an example array of LEDs mounted on the electronic board of FIG. 6A.
Figure 6A:
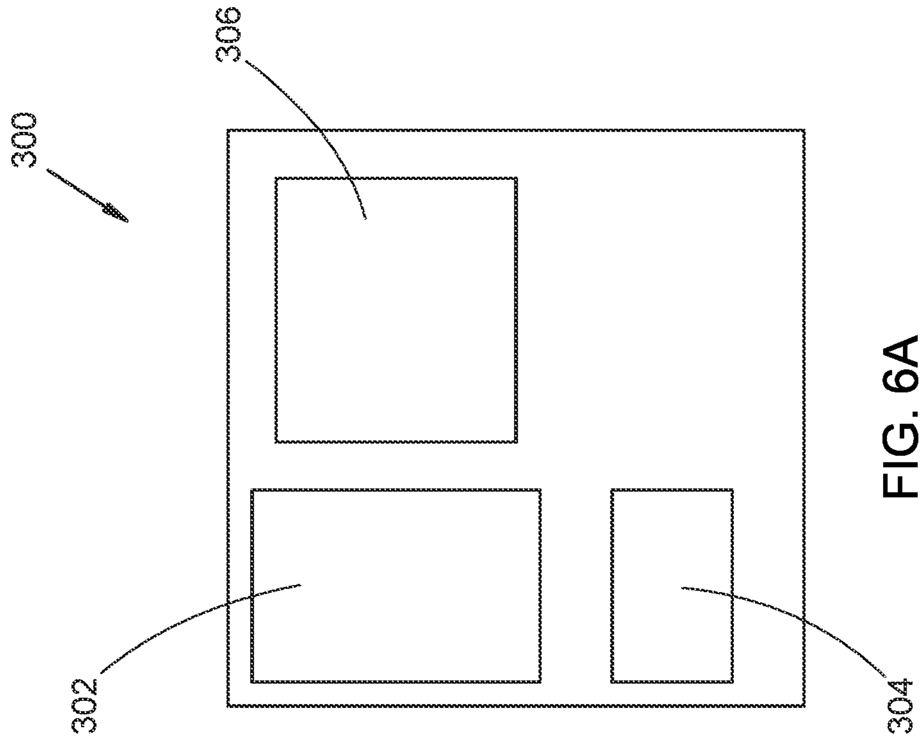
FIG. 6A shows a schematic top view of an example electronics board on which an array of LEDs may be mounted.

As shown in FIGS. 6A and 6B, an LED array 200 may be mounted on an electronics board 300 comprising a power and control module 302, a sensor module 304, and an LED attach region 306 (e.g., arranged as a circuit board or electronic backplane). Power and control module 302 may receive power and control signals from external sources and signals from sensor module 304, based on which power and control module 302 controls operation of the LEDs. Sensor module 304 may receive signals from any suitable sensors, for example from temperature or light sensors. Alternatively, an LED array 200 may be mounted on a separate circuit board or backplane from the power and control module and the sensor module.

An array of independently operable LEDs may be used in combination with a lens, lens system, or other optic or optical system (e.g., as described above) to provide illumination that is adaptable for a particular purpose. For example, in operation such an adaptive lighting system may provide illumination that varies by color and/or intensity across an illuminated scene or object and/or is aimed in a desired direction. Beam focus or steering of light emitted by the LED array can be performed electronically by activating LEDs in groups of varying size or in sequence, to permit dynamic adjustment of the beam shape and/or direction without moving optics or changing the focus of the lens in the lighting apparatus. A controller can be configured to receive data indicating locations and color characteristics of objects or persons in a scene and based on that information control LEDs in an array to provide illumination adapted to the scene. Such data can be provided for example by an image sensor, or optical (e.g., laser scanning) or non-optical (e.g., millimeter radar) sensors. Such adaptive illumination is increasingly important for automotive (e.g., adaptive headlights), mobile device camera (e.g., adaptive flash), AR, VR, and MR applications such as those described below.

Figure 7A:
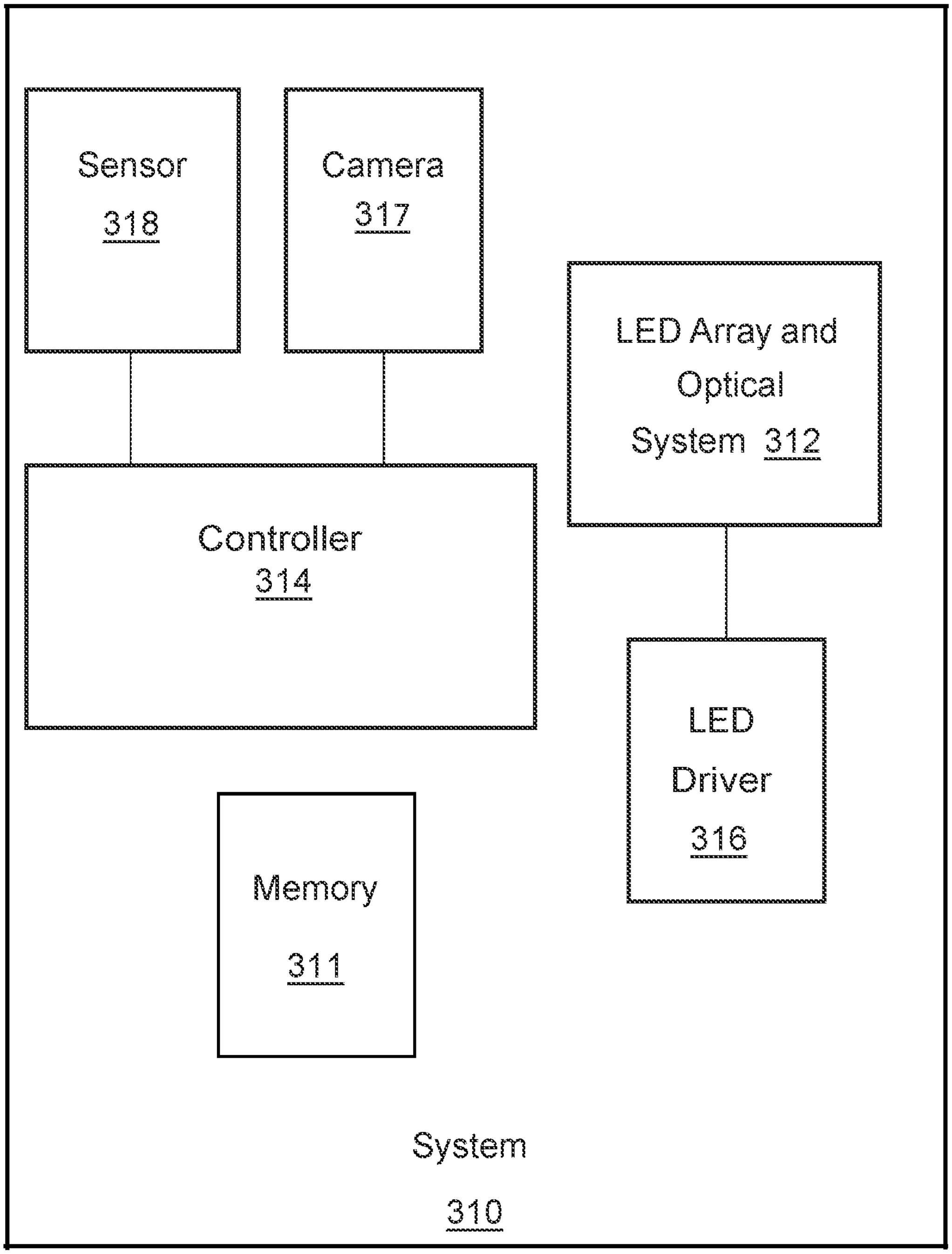
FIG. 7A schematically illustrates an example camera flash system.

FIG. 7A schematically illustrates an example camera flash system 310 comprising an LED array and an optical (e.g., lens) system 312, which may be or comprise an adaptive lighting system as described above in which LEDs in the array may be individually operable or operable as groups. In operation of the camera flash system, illumination from some or all of the LEDs in array and optical system 312 may be adjusted-deactivated, operated at full intensity, or operated at an intermediate intensity. The array may be a monolithic array, or comprise one or more monolithic arrays, as described above. The array may be a microLED array, as described above.

Flash system 310 also comprises an LED driver 316 that is controlled by a controller 314, such as a microprocessor. Controller 314 may also be coupled to a camera 317 and to sensors 318 and operate in accordance with instructions and profiles stored in memory 311. Camera 317 and LED array and lens system 312 may be controlled by controller 314 to, for example, match the illumination provided by system 312 (i.e., the field of view of the illumination system) to the field of view of camera 317, or to otherwise adapt the illumination provided by system 312 to the scene viewed by the camera as described above. Sensors 318 may include, for example, positional sensors (e.g., a gyroscope and/or accelerometer) and/or other sensors that may be used to determine the position and orientation of system 310.

Figure 7B:
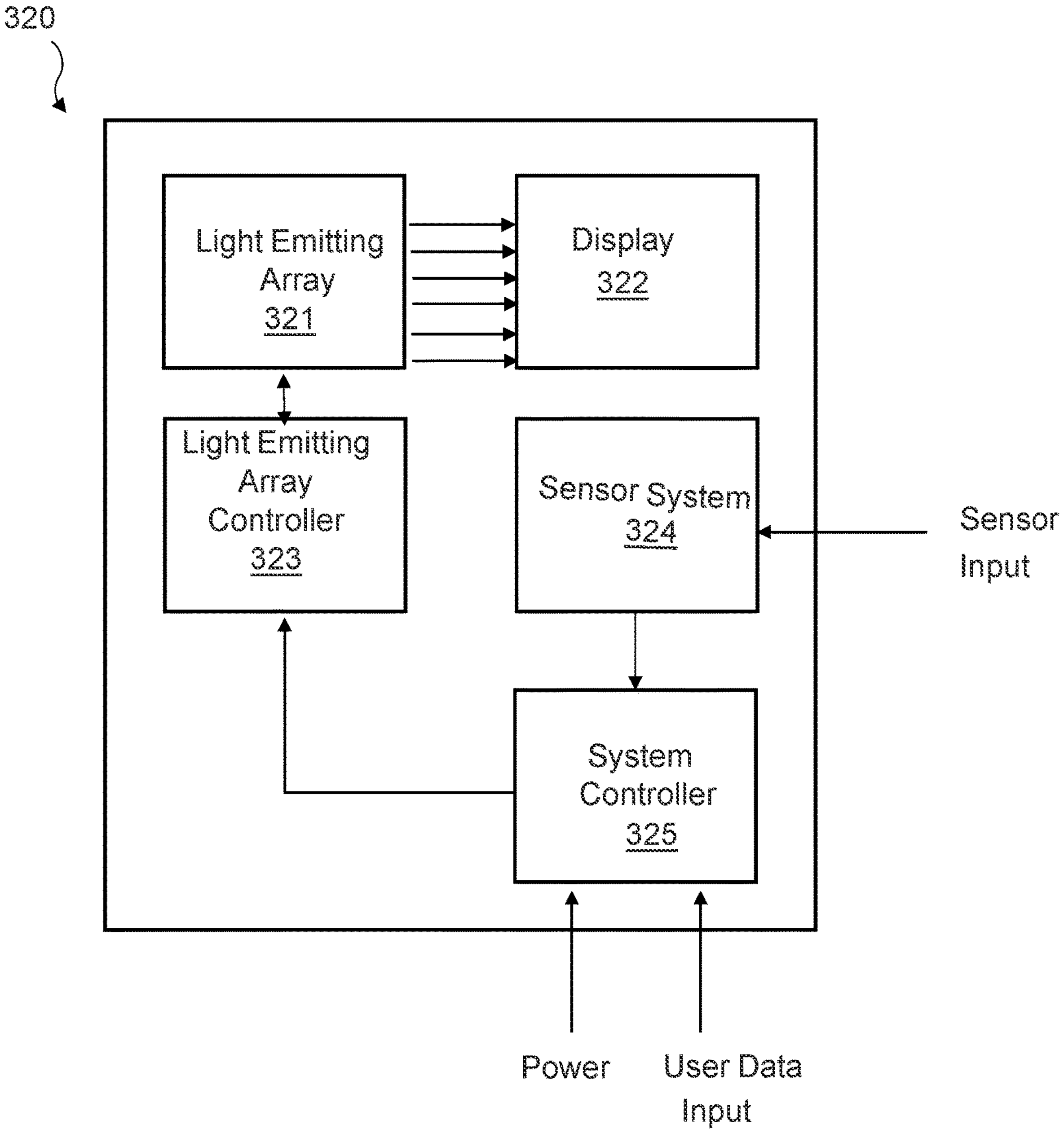
FIG. 7B schematically illustrates an example display system.

FIG. 7B schematically illustrates an example display system 320 that includes an array 321 of LEDs that are individually operable or operable in groups, a display 322, a light-emitting array controller 323, a sensor system 324, and a system controller 325. Array 321 may be a monolithic array, or comprise one or more monolithic arrays, as described above. The array may be monochromatic. Alternatively, the array may be a multicolor array in which different LEDs in the array are configured to emit different colors of light, as described above. The array may therefore be or comprise a monolithic multicolor matrix of individually operable LEDs, which may for example be microLEDs as described above. A single individually operable LED or a group of adjacent such LEDs in the array may correspond to a single pixel (picture element) in the display. For example, a group of three individually operable adjacent LEDs comprising a red emitter, a blue emitter, and a green emitter may correspond to a single color-tunable pixel in the display. Similarly, to provide redundancy in the event of a defective LED, a group of six individually operable adjacent LEDs comprising two red emitters, two blue emitters, and two green emitters may correspond to a single color-tunable pixel in the display Array 321 can be used to project light in graphical or object patterns that can for example support AR/VR/MR systems (i.e., visualization systems). In some cases the individual emitters can be referred to as pixels even if several are operated together to act as a single pixel of a display.

Sensor input is provided to the sensor system 324, while power and user data input is provided to the system controller 325. In some embodiments modules included in system 320 can be compactly arranged in a single structure, or one or more elements can be separately mounted and connected via wireless or wired communication. For example, array 321, display 322, and sensor system 324 can be mounted on a headset or glasses, with the light-emitting array controller and/or system controller 325 separately mounted.

System 320 can incorporate a wide range of optics (not shown) to couple light emitted by array 321 into display 322. Any suitable optics may be used for this purpose.

Sensor system 324 can include, for example, external sensors such as cameras, depth sensors, or audio sensors that monitor the environment, and internal sensors such as accelerometers or two or three axis gyroscopes that monitor an AR/VR/MR headset position. Other sensors can include but are not limited to air pressure, stress sensors, temperature sensors, or any other suitable sensors needed for local or remote environmental monitoring. In some embodiments, control input through the sensor system can include detected touch or taps, gestural input, or control based on headset or display position.

In response to data from sensor system 324, system controller 325 can send images or instructions to the light-emitting array controller 323. Changes or modification to the images or instructions can also be made by user data input, or automated data input as needed. User data input can include but is not limited to that provided by audio instructions, haptic feedback, eye or pupil positioning, or connected keyboard, mouse, or game controller.

As noted above, AR, VR, and MR systems may be more generally referred to as examples of visualization systems. In a virtual reality system, a display can present to a user a view of scene, such as a three-dimensional scene. The user can move within the scene, such as by repositioning the user's head or by walking. The virtual reality system can detect the user's movement and alter the view of the scene to account for the movement. For example, as a user rotates the user's head, the system can present views of the scene that vary in view directions to match the user's gaze. In this manner, the virtual reality system can simulate a user's presence in the three-dimensional scene. Further, a virtual reality system can receive tactile sensory input, such as from wearable position sensors, and can optionally provide tactile feedback to the user.

In an augmented reality system, the display can incorporate elements from the user's surroundings into the view of the scene. For example, the augmented reality system can add textual captions and/or visual elements to a view of the user's surroundings. For example, a retailer can use an augmented reality system to show a user what a piece of furniture would look like in a room of the user's home, by incorporating a visualization of the piece of furniture over a captured image of the user's surroundings. As the user moves around the user's room, the visualization accounts for the user's motion and alters the visualization of the furniture in a manner consistent with the motion. For example, the augmented reality system can position a virtual chair in a room. The user can stand in the room on a front side of the virtual chair location to view the front side of the chair. The user can move in the room to an area behind the virtual chair location to view a back side of the chair. In this manner, the augmented reality system can add elements to a dynamic view of the user's surroundings.

Figure 7C:
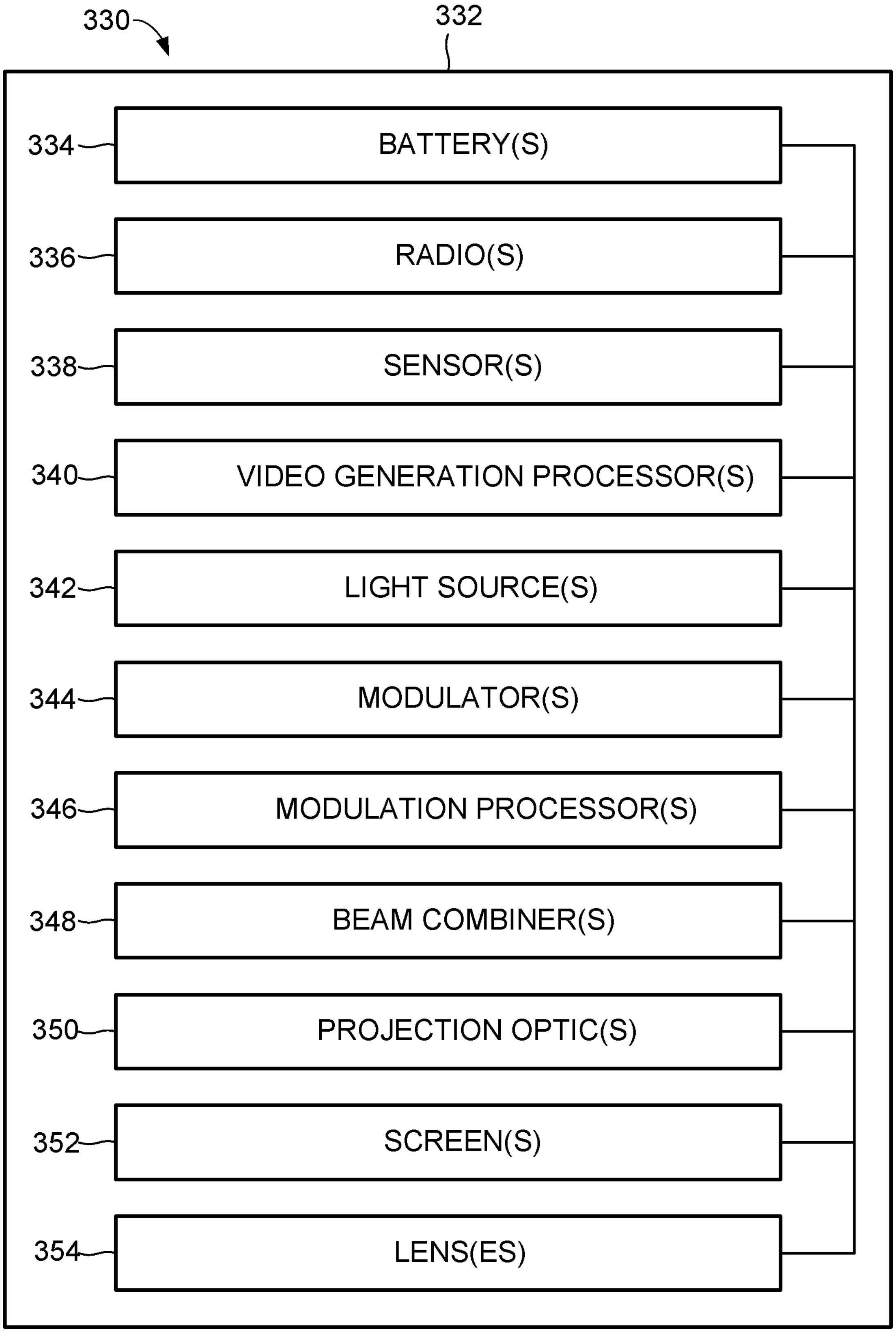
FIG. 7C shows a block diagram of an example visualization system.

FIG. 7C shows a generalized block diagram of an example visualization system 330. The visualization system 330 can include a wearable housing 332, such as a headset or goggles. The housing 332 can mechanically support and house the elements detailed below. In some examples, one or more of the elements detailed below can be included in one or more additional housings that can be separate from the wearable housing 332 and couplable to the wearable housing 332 wirelessly and/or via a wired connection. For example, a separate housing can reduce the weight of wearable goggles, such as by including batteries, radios, and other elements. The housing 332 can include one or more batteries 334, which can electrically power any or all of the elements detailed below. The housing 332 can include circuitry that can electrically couple to an external power supply, such as a wall outlet, to recharge the batteries 334. The housing 332 can include one or more radios 336 to communicate wirelessly with a server or network via a suitable protocol, such as WiFi.

The visualization system 330 can include one or more sensors 338, such as optical sensors, audio sensors, tactile sensors, thermal sensors, gyroscopic sensors, time-of-flight sensors, triangulation-based sensors, and others. In some examples, one or more of the sensors can sense a location, a position, and/or an orientation of a user. In some examples, one or more of the sensors 338 can produce a sensor signal in response to the sensed location, position, and/or orientation. The sensor signal can include sensor data that corresponds to a sensed location, position, and/or orientation. For example, the sensor data can include a depth map of the surroundings. In some examples, such as for an augmented reality system, one or more of the sensors 338 can capture a real-time video image of the surroundings proximate a user.

The visualization system 330 can include one or more video generation processors 340. The one or more video generation processors 340 can receive, from a server and/or a storage medium, scene data that represents a three-dimensional scene, such as a set of position coordinates for objects in the scene or a depth map of the scene. The one or more video generation processors 340 can receive one or more sensor signals from the one or more sensors 338. In response to the scene data, which represents the surroundings, and at least one sensor signal, which represents the location and/or orientation of the user with respect to the surroundings, the one or more video generation processors 340 can generate at least one video signal that corresponds to a view of the scene. In some examples, the one or more video generation processors 340 can generate two video signals, one for each eye of the user, that represent a view of the scene from a point of view of the left eye and the right eye of the user, respectively. In some examples, the one or more video generation processors 340 can generate more than two video signals and combine the video signals to provide one video signal for both eyes, two video signals for the two eyes, or other combinations.

The visualization system 330 can include one or more light sources 342 that can provide light for a display of the visualization system 330. Suitable light sources 342 can include any of the LEDs, pcLEDs, LED arrays, and pcLED arrays discussed above, for example those discussed above with respect to display system 320.

The visualization system 330 can include one or more modulators 344. The modulators 344 can be implemented in one of at least two configurations.

In a first configuration, the modulators 344 can include circuitry that can modulate the light sources 342 directly. For example, the light sources 342 can include an array of light-emitting diodes, and the modulators 344 can directly modulate the electrical power, electrical voltage, and/or electrical current directed to each light-emitting diode in the array to form modulated light. The modulation can be performed in an analog manner and/or a digital manner. In some examples, the light sources 342 can include an array of red light-emitting diodes, an array of green light-emitting diodes, and an array of blue light-emitting diodes, and the modulators 344 can directly modulate the red light-emitting diodes, the green light-emitting diodes, and the blue light-emitting diodes to form the modulated light to produce a specified image.

In a second configuration, the modulators 344 can include a modulation panel, such as a liquid crystal panel. The light sources 342 can produce uniform illumination, or nearly uniform illumination, to illuminate the modulation panel. The modulation panel can include pixels. Each pixel can selectively attenuate a respective portion of the modulation panel area in response to an electrical modulation signal to form the modulated light. In some examples, the modulators 344 can include multiple modulation panels that can modulate different colors of light. For example, the modulators 344 can include a red modulation panel that can attenuate red light from a red light source such as a red light-emitting diode, a green modulation panel that can attenuate green light from a green light source such as a green light-emitting diode, and a blue modulation panel that can attenuate blue light from a blue light source such as a blue light-emitting diode.

In some examples of the second configuration, the modulators 344 can receive uniform white light or nearly uniform white light from a white light source, such as a white-light light-emitting diode. The modulation panel can include wavelength-selective filters on each pixel of the modulation panel. The panel pixels can be arranged in groups (such as groups of three or four), where each group can form a pixel of a color image. For example, each group can include a panel pixel with a red color filter, a panel pixel with a green color filter, and a panel pixel with a blue color filter. Other suitable configurations can also be used.

The visualization system 330 can include one or more modulation processors 346, which can receive a video signal, such as from the one or more video generation processors 340, and, in response, can produce an electrical modulation signal. For configurations in which the modulators 344 directly modulate the light sources 342, the electrical modulation signal can drive the light sources 344. For configurations in which the modulators 344 include a modulation panel, the electrical modulation signal can drive the modulation panel.

The visualization system 330 can include one or more beam combiners 348 (also known as beam splitters 348), which can combine light beams of different colors to form a single multi-color beam. For configurations in which the light sources 342 can include multiple light-emitting diodes of different colors, the visualization system 330 can include one or more wavelength-sensitive (e.g., dichroic) beam splitters 348 that can combine the light of different colors to form a single multi-color beam.

The visualization system 330 can direct the modulated light toward the eyes of the viewer in one of at least two configurations. In a first configuration, the visualization system 330 can function as a projector, and can include suitable projection optics 350 that can project the modulated light onto one or more screens 352. The screens 352 can be located a suitable distance from an eye of the user. The visualization system 330 can optionally include one or more lenses 354 that can locate a virtual image of a screen 352 at a suitable distance from the eye, such as a close-focus distance, such as 500 mm, 750 mm, or another suitable distance. In some examples, the visualization system 330 can include a single screen 352, such that the modulated light can be directed toward both eyes of the user. In some examples, the visualization system 330 can include two screens 352, such that the modulated light from each screen 352 can be directed toward a respective eye of the user. In some examples, the visualization system 330 can include more than two screens 352. In a second configuration, the visualization system 330 can direct the modulated light directly into one or both eyes of a viewer. For example, the projection optics 350 can form an image on a retina of an eye of the user, or an image on each retina of the two eyes of the user.

For some configurations of augmented reality systems, the visualization system 330 can include an at least partially transparent display, such that a user can view the user's surroundings through the display. For such configurations, the augmented reality system can produce modulated light that corresponds to the augmentation of the surroundings, rather than the surroundings itself. For example, in the example of a retailer showing a chair, the augmented reality system can direct modulated light, corresponding to the chair but not the rest of the room, toward a screen or toward an eye of a user.

For purposes of the present disclosure and appended claims, any arrangement of a layer, surface, substrate, diode structure, or other structure "on," "over," or "against" another such structure shall encompass arrangements with direct contact between the two structures as well as arrangements including some intervening structure between them. Conversely, any arrangement of a layer, surface, substrate, diode structure, or other structure "directly on," "directly over," or "directly against" another such structure shall encompass only arrangements with direct contact between the two structures. For purposes of the present disclosure and appended claims, a layer, structure, or material described as "transparent" and "substantially transparent" shall exhibit, at the nominal emission vacuum wavelength 2, a level of optical transmission that is sufficiently high, or a level of optical loss (due to absorption, scattering, or other loss mechanism) that is sufficiently low, that the light-emitting device can function within operationally acceptable parameters (e.g., output power or luminance, conversion or extraction efficiency, or other figures-of-merit including any described herein).

Figure 8A:
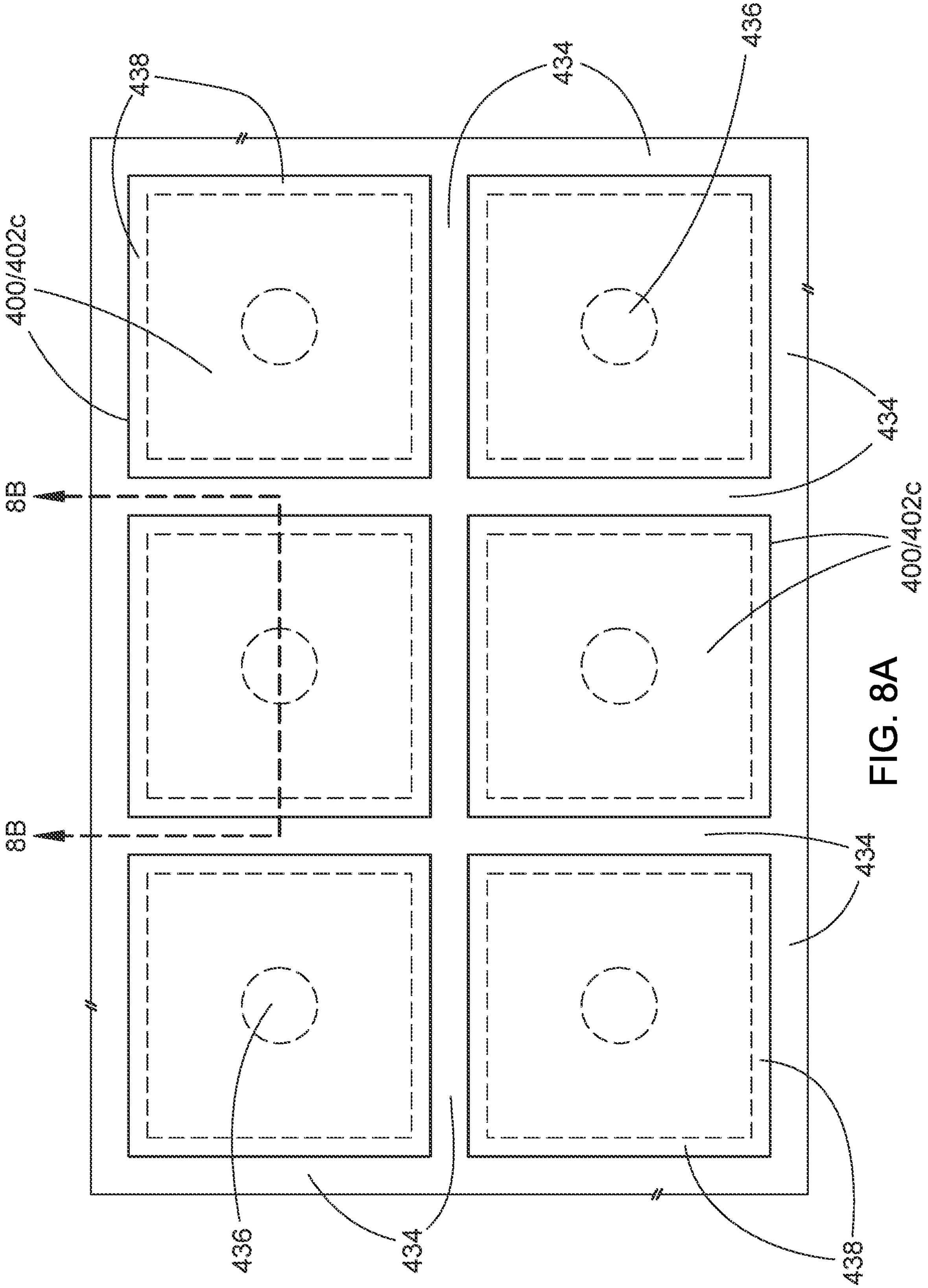
FIG. 8A is a schematic plan view of a 2×3 section of an LED array in a conventional arrangement.
Figure 8B:
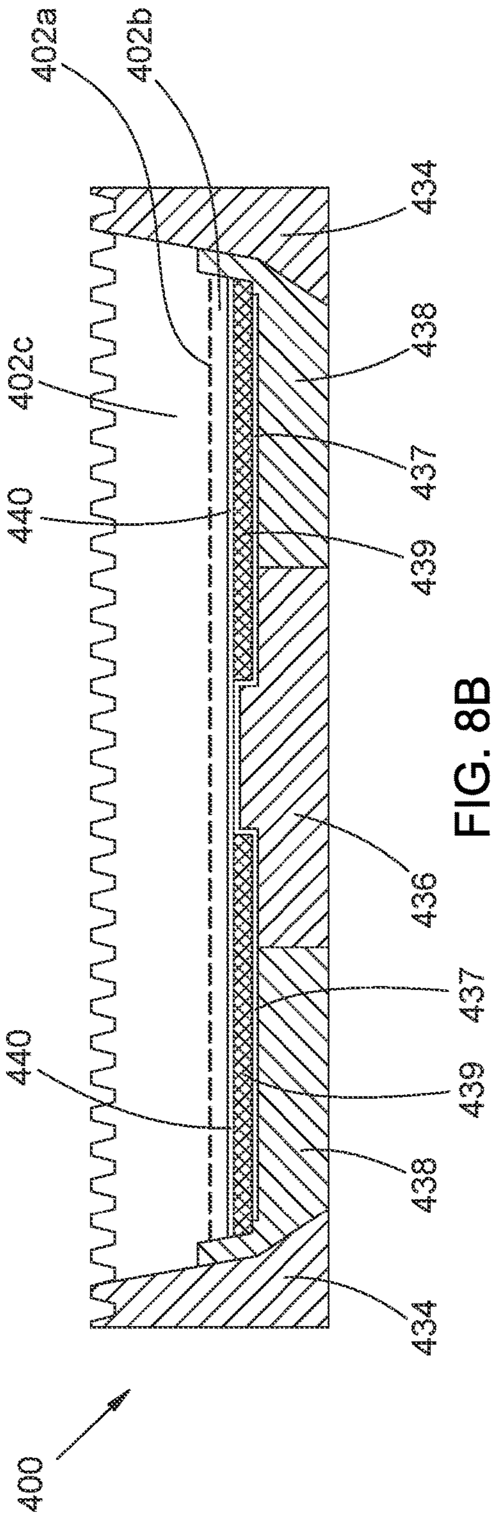
FIG. 8B is a schematic side cross-sectional view of one LED of the array of FIG. 8A arranged as a direct emitter.
Figure 8C:
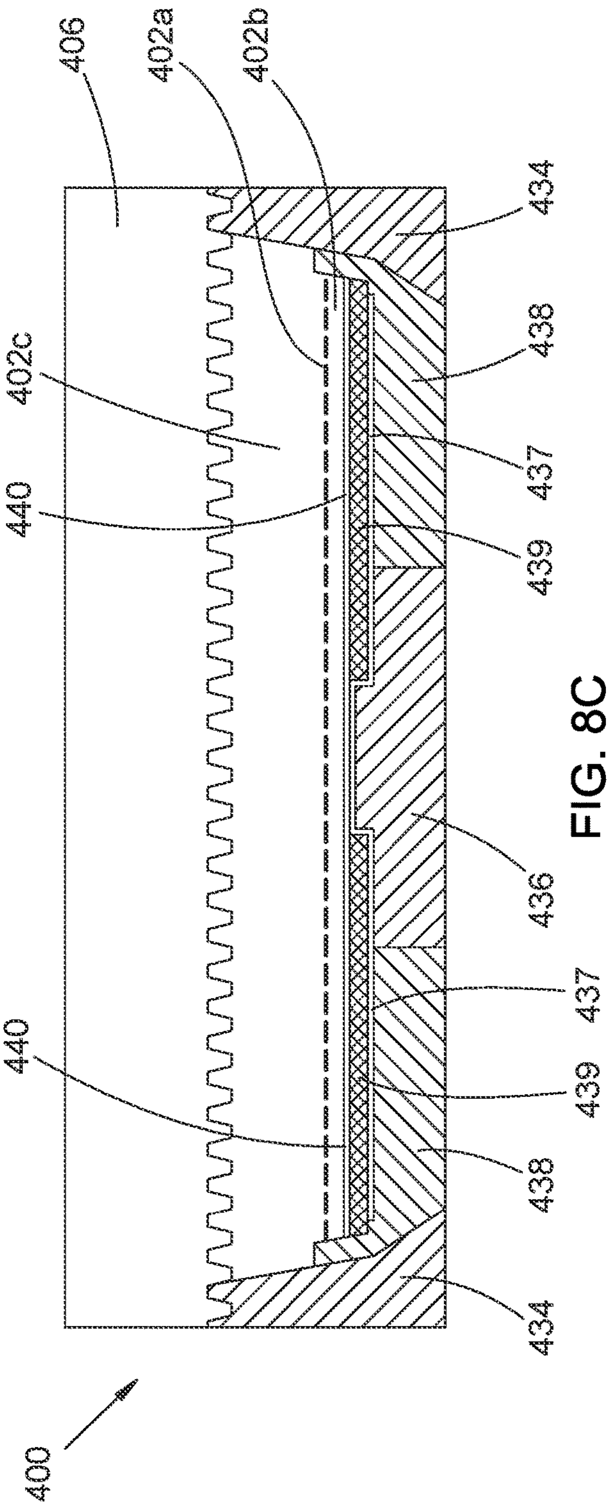
FIG. 8C is a schematic side cross-sectional view of one LED of the array of FIG. 8A that also includes a wavelength converter.

An example of a conventional LED arrangement that can be employed in an LED array (including any of the LED arrays described above) is illustrated schematically in FIGS. 8A-8C. FIG. 8A is a schematic plan view of 2×3 section of an LED array; FIG. 8B is a schematic side cross-sectional view of one LED 400 of the array arranged as a direct emitter; FIG. 8C is a schematic side cross-sectional view of one LED 400 of the array that also includes a wavelength converter. The LED 400 comprises a p-doped semiconductor layer 402*b*, an n-doped semiconductor layer 402*c*, and an active region 402*a* between them from which LED light is emitted as a result of radiative recombination of charge carriers. The doped semiconductor layers and active regions typically comprise one or more III-nitride semiconductor materials, as described above. A p-contact 436 is in electrical contact with the p-doped layer 402*b* and an n-contact 434 is in contact with the n-doped layer 402*c*. The p-contact 436 typically can be localized on the corresponding p-doped layer 402*b* to only a central region of the LED 400, passing through insulating dielectric layers 438 and 439 (transverse positions and arrangement of the p-contacts 436 indicated by the dashed circles in FIG. 8A; shown in cross-section in FIGS. 8B and 8C). The p-contact 436 typically can include one or more metals or metal alloys (e.g., aluminum, copper, silver, or gold). A metallic layer 437 (e.g., platinum-silver, or titanium-platinum-gold; arranged as a single, homogeneous layer or as multiple, discrete layers) can extend laterally between the dielectric layers 438 and 439 to act as a backside reflector for the LED 500, and also can be employed to enhance electrical contact between the p-contact 436 and the p-doped layer 402*b*. A layer 440 of a transparent conductive oxide (e.g., indium tin oxide (ITO) or indium zinc oxide (IZO)) can be positioned between the electrode 436 and the p-doped layer 402*b*, and can extend laterally between the dielectric layer 439 and the p-doped layer 402*b*. The metallic layer 437 and the TCO layer 440 of each LED 400 are electrically isolated from those of adjacent LEDs 400.

The n-contact 434 typically can be localized to only peripheral regions of the LED 400, and extends through the p-doped layer 402*b*, the active regions 402*a*, and the n-doped layer 402*c*, entirely circumscribing the LED 400 and separating it from its neighboring LEDs in the array. The n-contact 434 of adjacent LEDs can make contact with the n-doped layer 402*c* around the periphery of the LED 400, or in some instances through a transparent electrode on the surface of the n-doped layer 402*c* (not shown). The n-contact 434 is electrically isolated from the p-doped layer 402*b* and the active region 402*a*, and from the p-contact 436, metallic layer 437, and TCO Layer 440, typically by intervening electrically insulating material of one or both of the dielectric layers 438 or 439 (transverse position and arrangement of the intervening material of dielectric layer 438 indicated by the dashed rectangles of FIG. 8A; shown in cross-section in FIGS. 8B and 8C). The n-contacts 434 typically can include one or more metals or metal alloys (e.g., aluminum, copper, silver, or gold), and often can include an intervening layer for enhancing electrical contact between the metallic material of the contact 434 and semiconductor material of the n-doped layer 402*c* (e.g., platinum-silver or titanium-platinum-gold).

In the conventional arrangement of FIGS. 8A-8C, the n-contacts 434 of the array act as optical barriers between adjacent LEDs 400 of an array. However, such metal layers in electrical contact with semiconductor surfaces form relatively poor optical reflectors. Consequently, the external quantum efficiency of the LED 400 can be limited by optical absorption by the metallic material(s) of the n-contacts 434 on the side surfaces of the n-doped layer 402*c* of the LED 400.

Arrays of LEDs 400 are often formed by epitaxial growth of the semiconductor layers on a fabrication substrate, usually sapphire. The sapphire surface typically is patterned so as to create a patterned surface of the n-doped semiconductor layer 402*c* of the LED 400. That surface serves as the output surface of the LED 400, and the patterning enhances light extraction from the LED 400. After epitaxial formation of the semiconductor layers 402*a*/402*b*/402*c*, followed by etching and deposition processes to form the contacts 434/436 and layers 437/439/440, the array of LEDs 400 is removed from the fabrication substrate by separating the n-doped layer 402*c* from that substrate (e.g., using a laser lift-off process to separate n-doped III-nitride material from sapphire). In some examples the array of LEDs is mounted or bonded onto an electrical backplane (e.g., similar to FIG. 4B, 4C, 5B, or 6B) so as to connect the n- and p-contacts 434/436 to circuitry on the backplane that enables selective operation of individual LEDs of the array, or groups of LEDs of the array. Any suitable arrangement of the LED array can be employed to achieve the mounting or bonding, in some examples including additional deposition and/or etching processes on exposed surfaces of the contacts 434/436 and/or the dielectric layer 438. Such bonding to a backplane can be done with the LEDs still attached to the fabrication substrate, which can be removed after the bonding to effectively transfer the LED array from the fabrication substrate to the backplane.

To form LEDs in the conventional arrangement of FIGS. 8A-8C, the semiconductor layers are etched through to the fabrication substrate. Metallic material of the n-contacts 434 formed within those trenches is in contact with the fabrication substrate and often interferes with the separation of the LEDs from the fabrication substrate. The n-contacts 434 also form a dark grid across the exit surface of the LED array, separating adjacent LEDs of the array. The appearance of such a dark grid can be undesirable in some instances.

It would be desirable to provide an arrangement for LEDs of an array in which the forgoing problems are mitigated or eliminated, e.g., in which contact between the fabrication substrate and metallic material of the n-contact is reduced or eliminated, in which appearance of a dark grid is reduced or eliminated, and/or in which electrical contact between the side surfaces of the LED and metallic material of the n-contact is reduced or eliminated.

Accordingly, examples of an inventive arrangement for LEDs of an array (including any of the LED arrays described above) are illustrated schematically in FIGS. 9A through 10E. A light-emitting device comprises an array of multiple LEDs 500. Each LED 500 of the array includes a corresponding n-doped semiconductor layer 502*c*, a corresponding p-doped semiconductor layer 502*b*, and a corresponding active region 502*a* between them. The semiconductor layers 502*b*/502*c* typically can include one or more III-nitride materials, or alloys or mixtures thereof; other suitable semiconductor materials can be employed (e.g., Ill-phosphide materials). The active region 502*a* can include one or more similar materials and can be arranged in any suitable way for providing light emission by radiative recombination of charge carriers at the active region 502*a* (e.g., a p-n junction, a quantum well (QW), a multi-quantum well (MQW), quantum dots, and so forth). Light is emitted from the active region at an LED wavelength that is determined by the composition and structure of the active region 502*a*. The LEDs 500 can be arranged as direct-emitting LEDs (e.g., as in FIGS. 9B, 10B, and 10C) or as phosphor-converted LEDs by including a phosphor wavelength-converting layer 506 (e.g., as in FIGS. 9C, 10D, and 10E). In some examples the wavelength-converting layer 506 can be an optically continuous layer that spans multiple LEDs 500, like the continuous n-doped layer 502*c* (discussed below); in other examples the wavelength-converting layer 506 can comprise discrete areal segments corresponding to each LED 500 of the array, as physically separate pieces or as distinct, optically separated regions of a continuous layer. The wavelength-converting layer 506 can be of any suitable type, composition, or arrangement. In some examples the array of LEDs 500 can have a nonzero spacing of the LEDs of the array being less than 200 μm, less than 100 μm, or less than 50 μm (while still being large enough for the LEDs 500 to function as LEDs).

One or more corresponding electrically conductive n-contacts 534 are in electrical contact with the n-doped layer 502*c*, and one or more electrically conductive p-contacts 536 are in electrical contact with the p-doped layer 502*b*. The n-contacts 534 or the p-contacts 536 typically can include one or more metals or metal alloys (e.g., aluminum, copper, silver, or gold), and in some examples can include an intervening layer for enhancing electrical contact between the metallic material of the contact 534/536 and semiconductor material of the LED 500 (e.g., platinum-silver or titanium-platinum-gold). The one or more p-contacts 536 are localized on the corresponding p-doped layer 502*b* to only a central region of the corresponding LED 500. In some examples a metallic layer 537 can be positioned between the p-contact 536 and the p-doped layer 502*b* and can extend laterally between insulating dielectric layers 538 and 539. In some examples a transparent conductive layer 540 can be positioned between the p-contact 536 and the p-doped layer 502*b*, and can extend laterally between the dielectric layer 539 and the p-doped layer 502*b*. The transparent conductive layer 540 can include, e.g., indium tin oxide (ITO), indium zinc oxide (IZO), other transparent conductive oxide (TCO), or combinations or mixtures thereof. The p-contact 536, the metallic layer 537 (if present), and the transparent conductive layer 540 (if present), are electrically isolated from those of adjacent LEDs 500 of the array. Note that p-contacts 536 can be considered electrically isolated from one another even if they are in contact with the same semiconductor layer(s) of the LED array.

For at least a subset of two or more LEDs 500 of the array, the corresponding n-doped layers 502*c* of the LEDs of the subset form a continuous n-doped layer 502*c* spanning the LEDs 500 of the subset. In some examples there can be only a single such subset of LEDs; in some of those examples the subset can include all of the LEDs 500 of the array, i.e., the continuous n-doped layer can span the entire array. In some other examples the array can be divided into two or more constituent subsets of LEDs 500, with each subset spanned by a corresponding continuous n-doped layer 502*c*. The one or more n-contacts 534 (*i*) are localized to only peripheral regions of the corresponding LEDs 500, (ii) extend through the p-doped layers 502*b* and the active regions 502*a* of adjacent LEDs 500 of the subset to make contact with the continuous n-doped layer 502*c*, and (iii) are electrically isolated from those p-doped layers and active regions, typically by intervening electrically insulating material of one or both of the dielectric layers 538 or 539.

The continuous n-doped layer 502*c* solves, or at least mitigates, some of the problems discussed above. Because the n-contact 534 does not penetrate the n-doped layer 502*c*, there would be no metal in contact with a fabrication substrate to interfere with any separation process (e.g., laser lift-off of a Ill-nitride n-doped layer 502*c* from a sapphire fabrication substrate). Because the n-contact does not penetrate the n-doped layer 502*c*, the presence of metallic material in electrical contact with side walls of the LED 500 is reduced or eliminated, which in turn can reduce undesirable optical absorption within the LED and so can increase external quantum efficiency. Because the n-doped layer 502*c* continuously spans multiple LEDs 500, appearance of dark grid lines between those LEDs can be reduced or eliminated.

However, the continuous span of the n-doped layer 502*c* across a subset of multiple LEDs 500 also means there is less optical isolation between adjacent LEDs of that subset, i.e., there can be an undesirable or unacceptable level of optical crosstalk between adjacent LEDs 500, or equivalently, an unacceptably low contrast ratio between adjacent LEDs 500. Such optical crosstalk can be reduced by limiting the thickness of the LEDs 500 and (if present) the wavelength-converting layer 506. In some examples the nonzero combined thickness of the n-doped layer, p-doped layer, and the active region can be less than 5 μm (while still being thick enough to function as an LED). In some examples the nonzero thickness of the wavelength-converting layer 506 can be less than 20 μm (while still being thick enough to convert a desired fraction of the LED light to a longer wavelength). In some examples those thickness limitations can yield acceptably low levels of optical crosstalk, in some examples similar to levels of optical crosstalk observed in conventional LED arrays (e.g., such as those in FIGS. 8A-8C). In some examples, contrast between adjacent LEDs 500 can be greater than 50:1, 100:1, 250:1, or 500:1. In some examples, a wavelength-converting layer 506 comprising phosphor particles having a D50 of 6 μm arranged in a layer 10-15 μm thick can exhibit sufficiently large wavelength conversion efficiency and sufficiently small optical crosstalk.

Figure 9A:
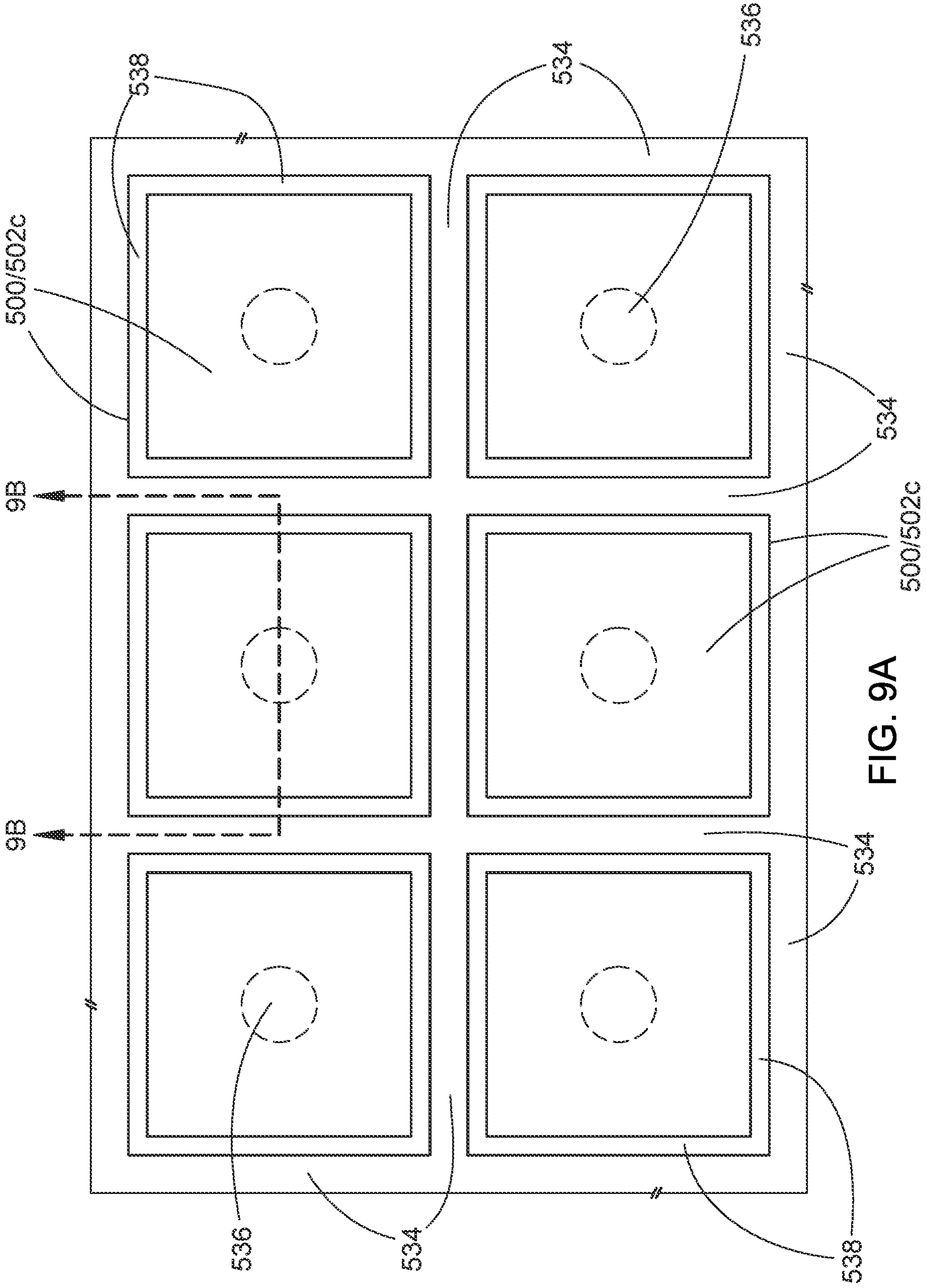
FIG. 9A is a schematic transverse cross-sectional view of a 2×3 section of an LED array in a first example inventive arrangement.
Figure 9B:
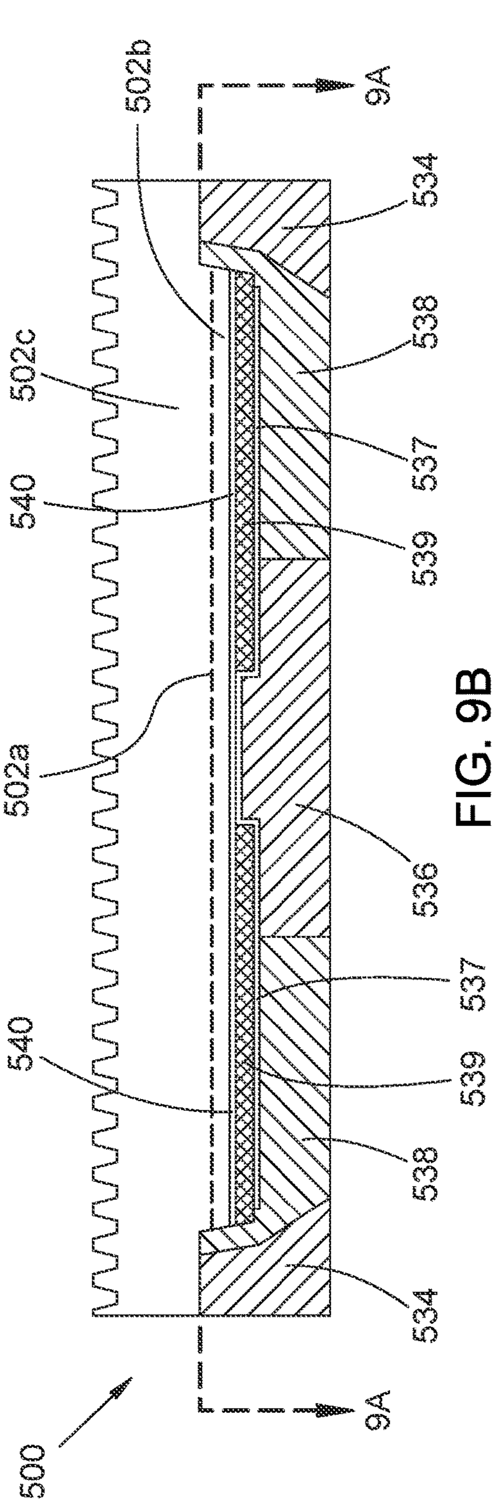
FIG. 9B is a schematic side cross-sectional view of an LED of the array of FIG. 9A arranged as a direct emitter.
Figure 9C:
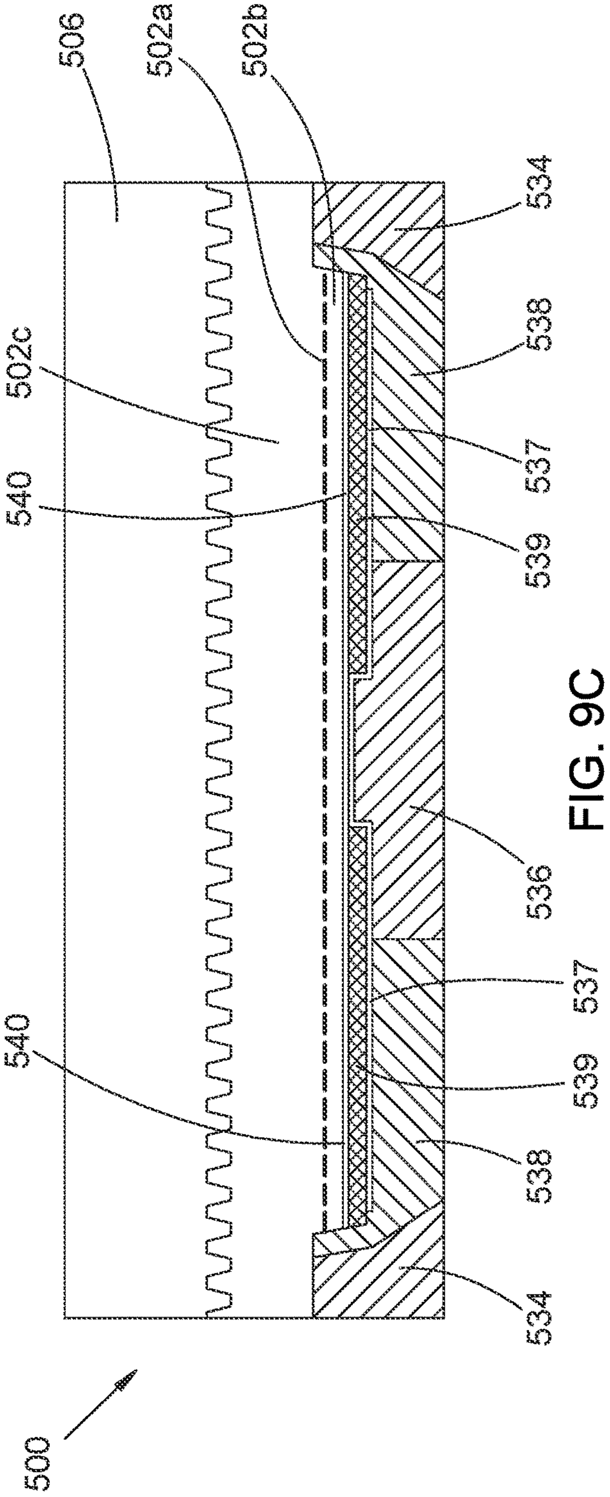
FIG. 9C is a schematic side cross-sectional view of an LED of the array of FIG. 9A that also includes a wavelength-converting layer.
Figure 10A:
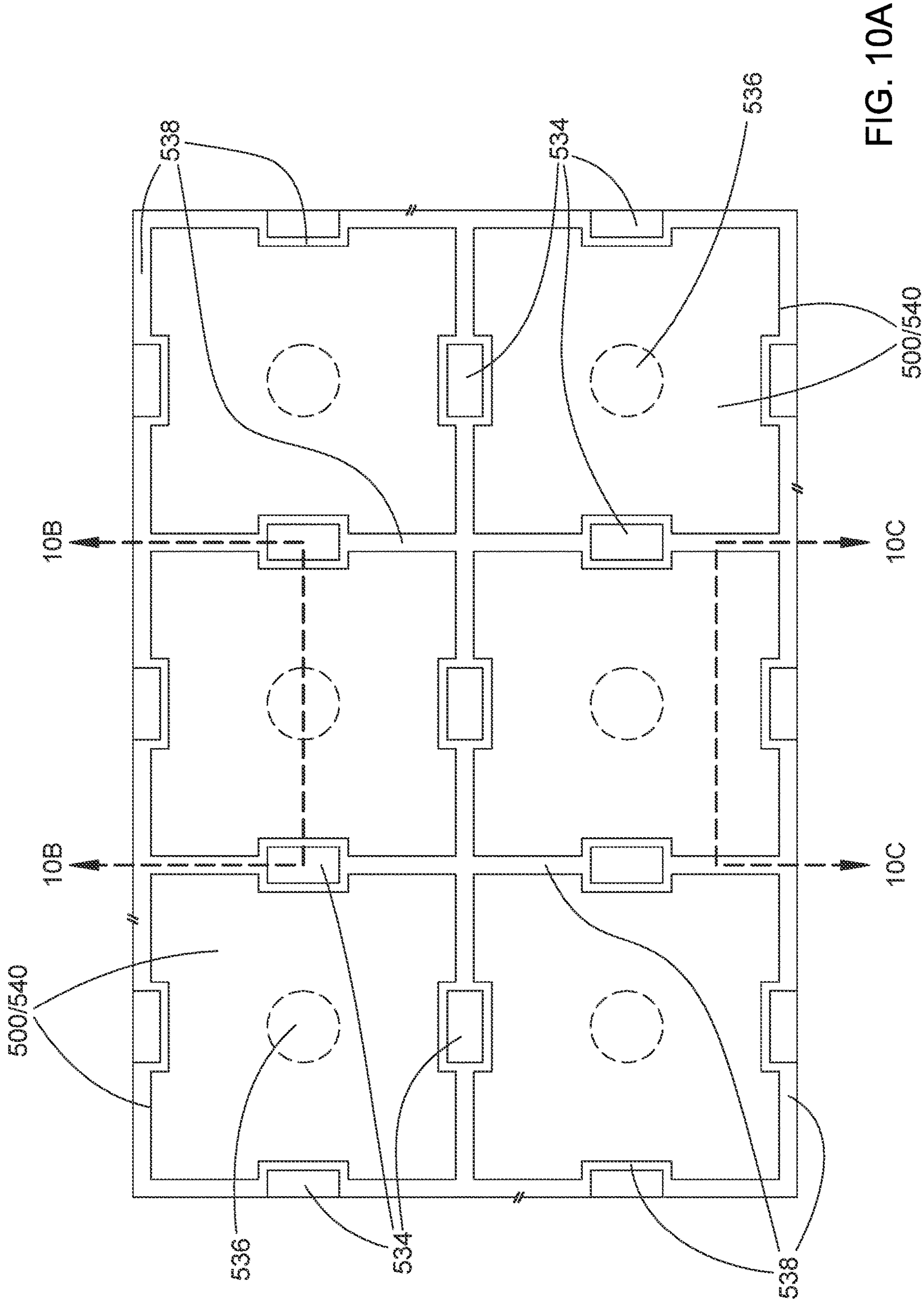
FIG. 10A is a schematic transverse cross-sectional view of a 2×3 section of an LED array in a second example inventive arrangement.
Figure 10B:
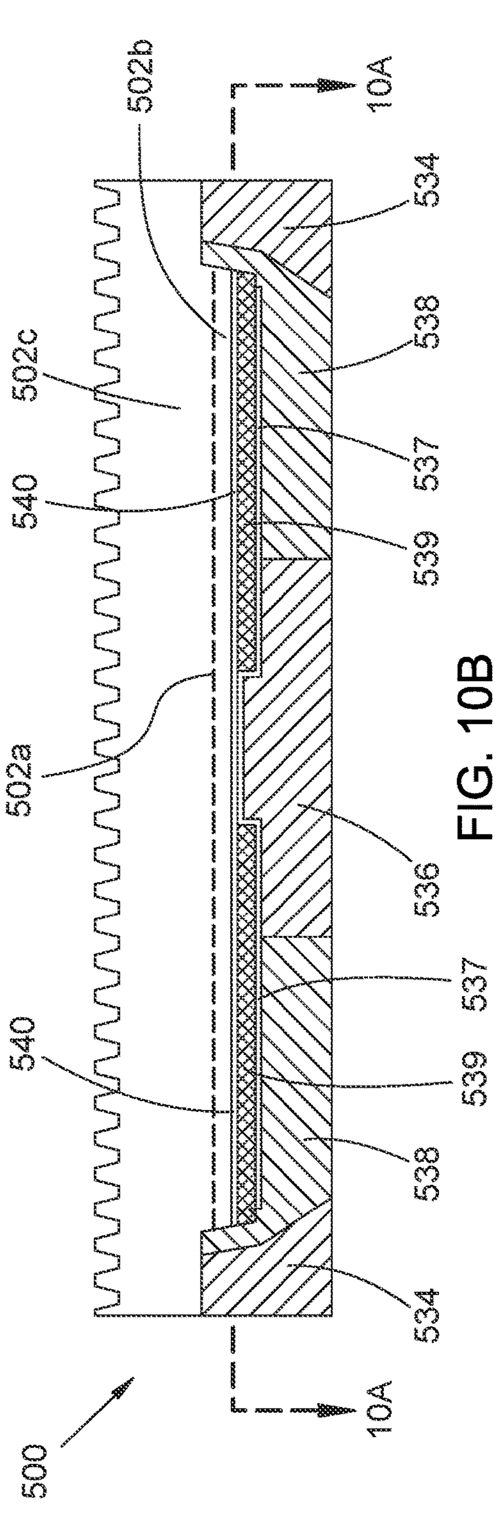
FIGS. 10B and 10C are schematic side cross-sectional views of an LED of the array of FIG. 10A arranged as a directed emitter.
Figure 10D:
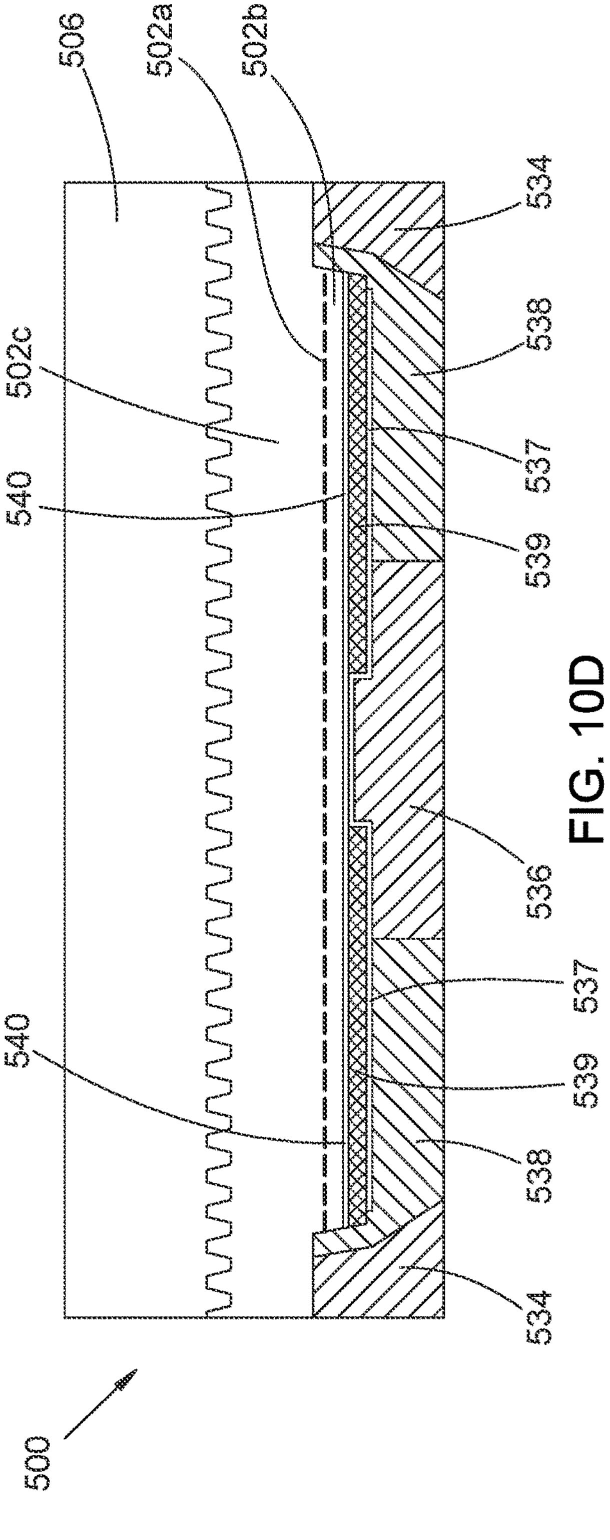
FIGS. 10D and 10E are schematic side cross-sectional views of an LED of the array of FIG. 10A that also includes a wavelength-converting layer.
Figure 10C:
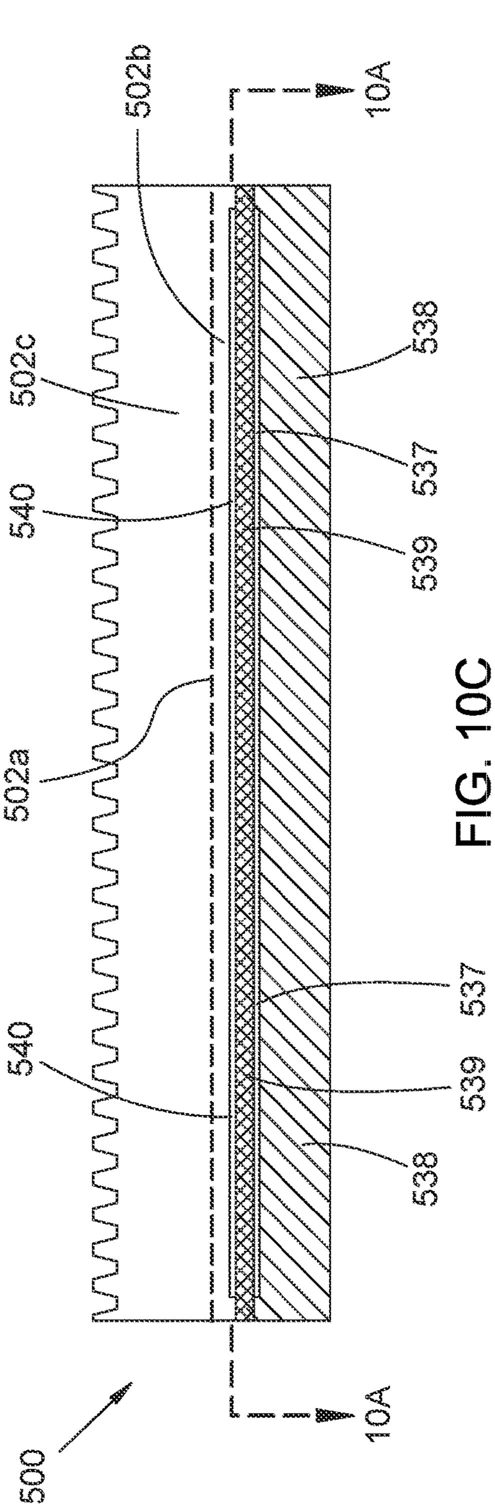
Figure 10E:
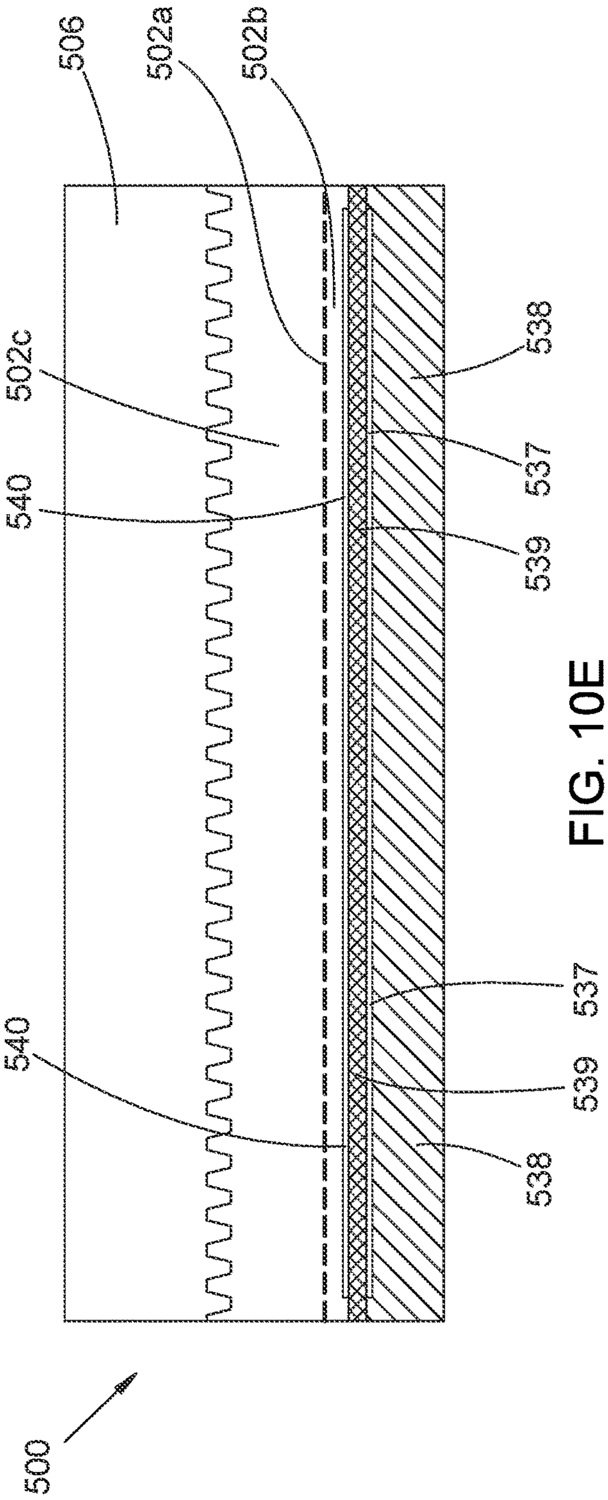

In some examples the LED 500 can include an electrically insulating layer 538 on the p-doped layer 502*b*, with the p-contact 536 extending through the electrically insulating layer to make contact with the p-doped layer 502*b* (positions and arrangement of the p-contacts indicated by the dashed circles in FIGS. 9A and 10A; shown in cross-section in FIGS. 9B, 9C, and 10B-10E). In some examples (including the examples shown), the electrically insulating material of the dielectric layer 538 that separates the n-contact 534 from the lateral edges of the p-doped layer 502*b* and the active region 502*a* extends toward the p-contact 536, and the p-contact 536 extends through the electrically insulating material of the dielectric layer 538 to make contact with the p-doped layer 502*b*. In some other examples the electrically insulating material through which the p-contact 536 extends can be separate from the electrically insulating material separating the n-contact 534 from the p-doped layer 502*b* and the active region 502*a*; those separate portions can be, but need not be, the same electrically insulating material. Some examples of suitable electrically insulating materials can include, e.g., doped or undoped silica, one or more doped or undoped metal or semiconductor oxides, nitrides, or oxynitrides, or combinations or mixtures thereof.

In some examples (e.g., as in FIGS. 9A-9C), the n-contacts 534 entirely circumscribe the p-doped layer 502*b* and the active region 502*a* of the LEDs 500. In such an arrangement the n-contacts 534 form a grid that divides the p-doped layer 502*b* and the active region 502*a* into discrete areal segments that correspond to the LEDs 500 of the array. Such segmentation of the p-doped layer 502*b* and the active region 502*a* can reduce or prevent electrical crosstalk between adjacent LEDs 500 of the array. In such examples in which a metallic layer 537 is present between the dielectric layers 538 and 539, and/or a transparent conductive layer 540 is present between the dielectric layer 539 and the p-doped layer 502*b*, the circumscribing n-contacts 534 also divide those layers 537 and/or 540 into discrete areal segments corresponding to the LEDs 500 of the array. Such segmentation of the metallic layer 537 (if present) or the transparent conductive layer 540 (if present) electrically isolates each p-contact 536 from corresponding p-contacts of adjacent LEDs 500 of the array.

In some examples (e.g., as in FIGS. 10A-10E), the n-contacts 534 can be arranged as one or more discrete, circumscribed n-contacts 534, so that (i) the corresponding p-doped semiconductor layers 502*b* of the LEDs 500 form a continuous p-doped layer spanning the LEDs 500 (or subsets thereof), and (ii) the corresponding active regions 502*a* of the LEDs 500 form a continuous active region spanning the LEDs 500 (or subsets thereof). Such an arrangement further reduces (relative to the arrangement of FIGS. 9A-9C) the side surface area of the LED 500 where emitted light can be absorbed by the metallic material(s) of the n-contacts 534, potentially further increasing light extraction efficiency and external quantum efficiency. The reduction of etched edges of the active region 502*a* also can reduce unwanted nonradiative carrier recombination that tends to be mediated by those etched edges, potentially increasing internal quantum efficiency, particularly at smaller device sizes wherein edge effects become relatively more prominent.

However, the continuous p-doped layer 502*b* and active region 502*a* can potentially allow undesirable electrical crosstalk between adjacent LEDs 500 of the array. Such electrical crosstalk can be reduced by localizing the p-contacts 536 to a central region of each LED 500. In some such examples in which a metallic layer 537 and/or a transparent conductive layer 540 are present, those layers 537 or 540 can extend laterally from the p-contact 540 between the p-doped layer 502*b* and the electrically insulating layers 538 and 539 over a circumscribed area of the LED 500, separated from circumscribed areas of those corresponding layer(s) of adjacent LEDs 500. In the cross-sectional view of FIG. 10A can be seen the transparent conductive layer 540 separated into discrete areal segments by a grid of electrically insulating material of the layer 538, each discrete areal segment of the transparent conductive layer 540 corresponding to one of the LEDs 500 of the array. The metallic layer 537 can be similarly separated into discrete segments. Separation of the metallic layer 537 and the transparent conductive layer 540 can reduce or prevent electronic crosstalk between adjacent LEDs 500 of the array by electrically isolating each p-contact 536 from corresponding p-contacts of adjacent LEDs 500 of the array.

The example inventive arrangements of the LEDs 500 disclosed herein can be suitably employed in any device comprising or incorporating an LED array, including any of those disclosed herein.

In some examples the array of LEDs 500 can be mounted or bonded onto a circuit board or an electronic backplane (e.g., similar to FIG. 4B, 4C, 5B, or 6B) so as to connect electronic circuitry to the n-contacts 534 and to the p-contacts 536. Any suitable arrangement of the LED array can be employed to achieve the mounting or bonding, in some examples including additional deposition and/or etching processes on exposed surfaces of the contacts 534/536 and/or the dielectric layer 538. In some examples the array of LEDs 500 can be connected to a power and control module (e.g., as in FIGS. 6A through 7C) that includes electronic circuitry structured and connected so as to enable selective activation of one or more LEDs 500 of the array or one or more groups of LEDs 500 of the array.

An inventive method for making any of the LED arrays described herein can begin with forming, on a fabrication substrate (e.g., a patterned sapphire substrate) the n-doped layer 502*c*, the active region 502*a* on the n-doped layer 502*c*, and the p-doped layer 502*b* on the active region 502*b*. As noted above, in some examples the nonzero total thickness of those three layers can be less than 5 μm. Next, holes (for the arrangement of FIGS. 10A-10E) or trenches (for the arrangement of FIGS. 9A-9C) are formed through the p-doped layer 502*b* and the active regions 502*a*. The holes or trenches are arranged in a pattern that defines the array of the multiple LEDs 500 in the p-doped layer 502*b* and the active region 502*a* while leaving the n-doped layer 502*c* as a continuous layer that spans multiple LEDs of the array (in some examples, spanning the entire array).

Electrically insulating dielectric layer 538 can be formed, with dielectric material of the layer 538 being formed or deposited within the holes or trenches on exposed edges of the p-doped layer 502*b* and active regions 502*a*. In some examples a deposition process can be employed, and in some of those examples an etch process can be employed to remove some of the deposited electrically insulating material 538 to re-expose the n-doped layer 502*c* within the holes or trenches (while leaving covered the edges of the p-doped layer 502*b* and the active region 502*a*). Then the n-contacts 534 can be formed within the holes or trenches so that the n-contacts are in electrical contact with the n-doped layer 534 but electrically isolated from the p-doped layers 502*b* and the active regions 502*a* of the LEDs 500 of the subset.

In some examples, before forming or depositing the dielectric layer 538, the transparent conductive layer 540 can be formed or deposited by any suitable spatially selective process on the p-doped layer 502*b* to form discrete, electrically isolated areal segments corresponding to the LEDs 500 of the array. The layer 539 of insulating dielectric material can then be formed or deposited, and a central opening for the p-contact 536 can be etched through the dielectric layer 539, or that layer can be formed with the opening by spatially selective deposition or growth. The metallic layer 537 can then be formed or deposited by any suitable spatially selective process to form discrete, electrically isolated areal segments corresponding to the LEDs 500 of the array. The dielectric layer 538 can then be formed or deposited, as described above.

The p-contacts 536 are formed on only the central region of each of the LEDs 500 of the subset. In some examples deposition of electrically insulating material in the holes or trenches also covers the p-doped layer 502*b*; in other examples electrically insulating material can be formed on the p-doped layer 502*b* in a separate process. In either of those examples, the p-contacts 536 extend through the electrically insulating material to make contact with the p-doped layer 502*b* (or the metallic layer 537 or the transparent conductive layer 540, if present). An opening through the electrically insulating material of the dielectric layer 538 can be formed by spatially selective deposition of that material (leaving exposed the central region of the p-doped layer 502*b*, the metallic layer 537, or the transparent conductive layer 540 of each LED 500), or by spatially selective removal of material (to expose the central region of the p-doped layer 502*b*, the metallic layer 537, or the transparent conductive layer 540 of each LED 500).

In some examples, the method can further comprise separating the n-doped layer from the fabrication substrate (e.g., by laser lift-off of a III-nitride n-doped layer from a patterned sapphire substrate).

In some examples, the method can further comprise forming a wavelength-converting layer 506 on the n-doped layer 502*c*. As noted above, in some of those examples nonzero thickness of the wavelength-converting layer can be less than 20 μm.

In some examples, the method can further comprise mounting or bonding the array of LEDs 500 onto a circuit board or on an electronic backplane to connect the n-contacts 534 and the p-contacts 536 to electronic circuitry. Any suitable arrangement of the LED array can be employed to achieve the mounting or bonding, in some examples including additional deposition and/or etching processes on exposed surfaces of the contacts 534/536 and/or the dielectric layer 538. In some of those examples the circuitry can be structured and connected so as to enable selective activation of one or more LEDs 500 of the array or one or more groups of LEDs 500 of the array. In some of those examples the array can be mounted while still attached to the fabrication substrate; after mounting the array, the n-doped layer 502*c* can be separated from the fabrication substrate, leaving the array of LEDs 500 mounted on the circuit board or electronic backplane.

In some examples, an inventive method can comprise connecting the n-contacts 534 and the p-contacts 536 to electronic circuitry of a power and control module; the circuitry can be structured and connected so as to enable selective activation of one or more LEDs 500 of the array or one or more groups of LEDs 500 of the array. An inventive method can comprise using the power and control module to operate the array of LEDs 500 by selectively activating a first set of certain LEDs 500 or groups of LEDs 500, while leaving deactivated other LEDs 500 or groups of LEDs 500. That method can further include, at a subsequent time, activating a second set of certain LEDs 500 or groups of LEDs 500, different from the first set, while leaving deactivated other LEDs 500 or groups of LEDs 500.

It should be noted that, for any of the example arrangements described above, the n-doped and p-doped layers can be interchanged, and the p-contacts and n-contacts can be interchanged, while remaining within the scope of the present inventive subject matter.

In addition to the preceding, the following example embodiments fall within the scope of the present disclosure or appended claims. Any given Example below that refers to "any preceding Example" shall be understood to refer to only those preceding Examples with which the given Example is not inconsistent, and to exclude those preceding Examples with which the given Example is inconsistent.

Example 1. A light-emitting device comprising an array of multiple semiconductor light-emitting diodes (LEDs), (a) each of the LEDs including (i) a corresponding n-doped semiconductor layer, (ii) a corresponding p-doped semiconductor layer, (iii) a corresponding active region therebetween, (iv) one or more corresponding electrically conductive n-contacts in electrical contact with the n-doped layer, and (v) one or more electrically conductive p-contacts in electrical contact with the p-doped layer, the active region being arranged for emitting light at a corresponding LED wavelength as a result of radiative recombination of charge carriers at the active region; (b) for at least a subset of two or more LEDs of the array, the corresponding n-doped layers of the LEDs of the subset forming a continuous n-doped layer spanning the LEDs of the subset; (c) for each of the LEDs of the subset, the corresponding one or more p-contacts being localized on the corresponding p-doped layer to only a central region of that LED and being electrically isolated from the p-contacts of adjacent LEDs of the subset; and (d) for each of the LEDs of the subset, the corresponding one or more n-contacts (i) being localized to only peripheral regions of the corresponding LEDs, (ii) extending through the p-doped layers and the active regions, but not through the continuous n-doped layer, of adjacent LEDs of the subset to make contact with the continuous n-doped layer, and (iii) being electrically isolated from those p-doped layers and active regions.

Example 2. The light-emitting device of Example 1, nonzero combined thickness of the n-doped layer, p-doped layer, and the active region being less than 5 μm.

Example 3. The light-emitting device of any one of Examples 1 or 2, nonzero spacing of the LEDs of the array being less than 200 μm, less than 100 μm, or less than 50 μm.

Example 4. The light-emitting device of any one of Examples 1 through 3, each of the n-doped layer, the p-doped layer, and the active region including one or more III-V semiconductor materials, or alloys or mixtures thereof.

Example 5. The light-emitting device of any one of Examples 1 through 4 further comprising a wavelength-converting layer on the continuous n-doped layer and spanning the LEDs of the subset, the wavelength-converting layer being arranged to absorb at least a portion of light emitted from the active region and emitting converted light at a converted wavelength that is longer than the LED wavelength.

Example 6. The light-emitting device of Example 5, nonzero thickness of the wavelength-converting layer being less than 20 μm.

Example 7. The light-emitting device of any one of Examples 1 through 6, for each of the LEDs of the subset, the corresponding one or more p-contacts including one or more metals or metal alloys.

Example 8. The light-emitting device of any one of Examples 1 through 7 further comprising, for each of the LEDs of the subset, a corresponding electrically insulating layer on the p-doped layer, the corresponding one or more p-contacts extending through the electrically insulating layer to make contact with the p-doped layer.

Example 9. The light-emitting device of Example 8, for each of the LEDs of the subset, the electrically insulating material including doped or undoped silica, one or more doped or undoped metal or semiconductor oxides, nitrides, or oxynitrides, or combinations or mixtures thereof.

Example 10. The light-emitting device of any one of Examples 8 or 9 further comprising, for each of the LEDs of the subset, a corresponding transparent conductive layer directly on the p-doped layer and extending laterally from the one or more p-contacts between the p-doped layer and the electrically insulating layer, the transparent conductive layer extending over a circumscribed area of the LED and being separated from corresponding transparent conductive layers of adjacent LEDs of the subset.

Example 11. The light-emitting device of Example 10, the transparent conductive layer including one or more of indium tin oxide (ITO), indium zinc oxide (IZO), another transparent conductive oxide (TCO), or combinations or mixtures thereof.

Example 12. The light-emitting device of any one of Examples 1 through 11, for each of the LEDs of the subset, the corresponding one or more n-contacts entirely circumscribe the p-doped layer and the active region of the LED.

Example 13. The light-emitting device of any one of Examples 1 through 11, for each of the LEDs of the substrate, the corresponding one or more n-contacts being arranged as one or more discrete, circumscribed n-contacts, so that (i) the corresponding p-doped semiconductor layers of the LEDs of the subset form a continuous p-doped layer spanning the LEDs of the subset, and (ii) the corresponding active regions of the LEDs of the subset form a continuous active region spanning the LEDs of the subset.

Example 14. The light-emitting device of any one of Examples 1 through 13, for each of the LEDs of the subset, the one or more n-contacts including one or more metals or metal alloys.

Example 15. The light-emitting device of any one of Examples 1 through 14 further comprising, for each of the LEDs of the subset, electrically insulating material separating the one or more n-contacts from the corresponding p-doped layer and the corresponding active region.

Example 16. The light-emitting device of Example 15, for each of the LEDs of the subset, the electrically insulating material including doped or undoped silica, one or more doped or undoped metal or semiconductor oxides, nitrides, or oxynitrides, or combinations or mixtures thereof.

Example 17. The light-emitting device of any one of Examples 1 through 16 further comprising a power and control module including electronic circuitry structured and connected so as to enable selective activation of one or more LEDs of the array or one or more groups of LEDs of the array.

Example 18. The light-emitting device of any one of Examples 1 through 17 further comprising a circuit board or an electronic backplane, the array of LEDs being mounted onto the board or backplane so as to connect electronic circuitry to the n-contacts and to the p-contacts.

Example 19. A method for making the light-emitting device of any one of Examples 1 through 18, the method comprising: (A) forming on a fabrication substrate the n-doped layer, the active region on the n-doped layer, and the p-doped layer on the active region; (B) forming holes or trenches through the p-doped layer and the active region, but not through the n-doped layer, in a pattern that defines the array of the multiple LEDs in the p-doped layer and the active region while leaving the n-doped layer as the continuous n-doped layer that spans the subset of two or more LEDs of the array; (C) forming electrically insulating material within the holes or trenches on exposed edges of the p-doped layer and the active region, and forming the n-contacts within the holes or trenches so that the n-contacts are (i) in electrical contact with the n-doped layer at only the peripheral regions of the LEDs of the subset, and (ii) electrically isolated from the p-doped layers and the active regions of the LEDs of the subset; and (D) forming the one or more corresponding p-contacts on only the central region of each of the LEDs of the subset.

Example 20. A method for making a light-emitting device, the method comprising: (A) forming on a fabrication substrate an n-doped semiconductor layer, an active region on the n-doped layer, and a p-doped semiconductor layer on the active region, the active region being arranged for emitting light at a corresponding LED wavelength as a result of radiative recombination of charge carriers at the active region; (B) forming holes or trenches through the p-doped layer and the active region, but not through the n-doped layer, in a pattern that defines an array of multiple LEDs in the p-doped layer and the active region while leaving the n-doped layer as a continuous n-doped layer that spans a subset of two or more LEDs of the array; (C) forming electrically insulating material within the holes or trenches on exposed edges of the p-doped layer and the active region, and forming electrically conductive n-contacts within the holes or trenches so that the n-contacts are (i) in electrical contact with the n-doped layer at only peripheral regions of the LEDs of the subset, and (ii) electrically isolated from the p-doped layers and the active regions of the LEDs of the subset; and (D) forming one or more corresponding electrically conductive p-contacts on only a central region of each of the LEDs of the subset.

Example 21. The method of any one of Examples 19 or 20, nonzero combined thickness of the n-doped layer, the p-doped layer, and the active region being less than 5 μm.

Example 22. The method of any one of Examples 19 through 21 further comprising forming a wavelength-converting layer on the n-doped layer.

Example 23. The method of Example 22, nonzero thickness of the wavelength-converting layer being less than 20 μm.

Example 24. The method of any one of Examples 19 through 23 further comprising separating the n-doped layer from the fabrication substrate.

Example 25. The method of any one of Examples 19 through 23 further comprising: mounting the array of LEDs on a circuit board or on an electronic backplane; and after mounting the array of LEDs on the board or the backplane, separating the n-doped layer from the fabrication substrate, the board or the backplane connecting the n-contacts and the p-contacts to electronic circuitry of a power and control module, the circuitry being structured and connected so as to enable selective activation of one or more LEDs of the array or one or more groups of LEDs of the array.

Example 26. The device or method of any preceding Example, wherein (i) the p-doped layer and the n-doped layer are interchanged, and (ii) the p-contacts and the n-contacts are interchanged.

This disclosure is illustrative and not limiting. Further modifications will be apparent to one skilled in the art in light of this disclosure and are intended to fall within the scope of the present disclosure or appended claims. It is intended that equivalents of the disclosed example embodiments and methods, or modifications thereof, shall fall within the scope of the present disclosure or appended claims.

In the foregoing Detailed Description, various features may be grouped together in several example embodiments for the purpose of streamlining the disclosure. This method of disclosure is not to be interpreted as reflecting an intention that any claimed embodiment requires more features than are expressly recited in the corresponding claim. Rather, as the appended claims reflect, inventive subject matter may lie in less than all features of any single disclosed example embodiment. Therefore, the present disclosure shall be construed as implicitly disclosing any embodiment having any suitable subset of one or more features—which features are shown, described, or claimed in the present application—including those subsets that may not be explicitly disclosed herein. A "suitable" subset of features includes only features that are neither incompatible nor mutually exclusive with respect to any other feature of that subset. Accordingly, the appended claims are hereby incorporated in their entirety into the Detailed Description, with each claim standing on its own as a separate disclosed embodiment. In addition, each of the appended dependent claims shall be interpreted, only for purposes of disclosure by said incorporation of the claims into the Detailed Description, as if written in multiple dependent form and dependent upon all preceding claims with which it is not inconsistent. It should be further noted that the cumulative scope of the appended claims can, but does not necessarily, encompass the whole of the subject matter disclosed in the present application.

The following interpretations shall apply for purposes of the present disclosure and appended claims. The words "comprising," "including," "having," and variants thereof, wherever they appear, shall be construed as open ended terminology, with the same meaning as if a phrase such as "at least" were appended after each instance thereof, unless explicitly stated otherwise. The article "a" shall be interpreted as "one or more" unless "only one," "a single," or other similar limitation is stated explicitly or is implicit in the particular context; similarly, the article "the" shall be interpreted as "one or more of the" unless "only one of the," "a single one of the," or other similar limitation is stated explicitly or is implicit in the particular context. The conjunction "or" is to be construed inclusively unless: (i) it is explicitly stated otherwise, e.g., by use of "either . . . or," "only one of," or similar language; or (ii) two or more of the listed alternatives are understood or disclosed (implicitly or explicitly) to be incompatible or mutually exclusive within the particular context. In that latter case, "or" would be understood to encompass only those combinations involving non-mutually-exclusive alternatives. In one example, each of "a dog or a cat," "one or more of a dog or a cat," and "one or more dogs or cats" would be interpreted as one or more dogs without any cats, or one or more cats without any dogs, or one or more of each.

For purposes of the present disclosure or appended claims, when a numerical quantity is recited (with or without terms such as "about," "about equal to," "substantially equal to," "greater than about," "less than about," and so forth), standard conventions pertaining to measurement precision, rounding error, and significant digits shall apply, unless a differing interpretation is explicitly set forth. For null quantities described by phrases such as "prevented," "absent," "eliminated," "equal to zero," "negligible," and so forth (with or without terms such as "substantially" or "about"), each such phrase shall denote the case wherein the quantity in question has been reduced or diminished to such an extent that, for practical purposes in the context of the intended operation or use of the disclosed or claimed apparatus or method, the overall behavior or performance of the apparatus or method does not differ from that which would have occurred had the null quantity in fact been completely removed, exactly equal to zero, or otherwise exactly nulled.

For purposes of the present disclosure and appended claims, any labelling of elements, steps, limitations, or other portions of an embodiment, example, or claim (e.g., first, second, third, etc., (a), (b), (c), etc., or (i), (ii), (iii), etc.) is only for purposes of clarity, and shall not be construed as implying any sort of ordering or precedence of the portions so labelled. If any such ordering or precedence is intended, it will be explicitly recited in the embodiment, example, or claim or, in some instances, it will be implicit or inherent based on the specific content of the embodiment, example, or claim. In the appended claims, if the provisions of 35 USC § 112(f) are desired to be invoked in an apparatus claim, then the word "means" will appear in that apparatus claim. If those provisions are desired to be invoked in a method claim, the words "a step for" will appear in that method claim. Conversely, if the words "means" or "a step for" do not appear in a claim, then the provisions of 35 USC § 112(f) are not intended to be invoked for that claim.

If any one or more disclosures are incorporated herein by reference and such incorporated disclosures conflict in part or whole with, or differ in scope from, the present disclosure, then to the extent of conflict, broader disclosure, or broader definition of terms, the present disclosure controls. If such incorporated disclosures conflict in part or whole with one another, then to the extent of conflict, the later-dated disclosure controls.

The Abstract is provided as required as an aid to those searching for specific subject matter within the patent literature. However, the Abstract is not intended to imply that any elements, features, or limitations recited therein are necessarily encompassed by any particular claim. The scope of subject matter encompassed by each claim shall be determined by the recitation of only that claim.

What is claimed is:

1. A light-emitting device comprising an array of multiple semiconductor light-emitting diodes (LEDs), (a) each of the LEDs including (i) a corresponding n-doped semiconductor layer, (ii) a corresponding p-doped semiconductor layer, (iii) a corresponding active region therebetween, (iv) one or more corresponding electrically conductive n-contacts in electrical contact with the n-doped layer, and (v) one or more electrically conductive p-contacts in electrical contact with the p-doped layer, the active region being arranged for emitting light at a corresponding LED wavelength as a result of radiative recombination of charge carriers at the active region;

(b) for at least a subset of two or more LEDs of the array, the corresponding n-doped layers of the LEDs of the subset forming a continuous n-doped layer spanning the LEDs of the subset;

(c) for each of the LEDs of the subset, the corresponding one or more p-contacts being localized on the corresponding p-doped layer to only a central region of that LED and being electrically isolated from the p-contacts of adjacent LEDs of the subset;

(d) for each of the LEDs of the subset, the corresponding one or more n-contacts (i) being localized to only peripheral regions of the corresponding LEDs, (ii) extending through the p-doped layers and the active regions, but not through the continuous n-doped layer, of adjacent LEDs of the subset to make contact with the continuous n-doped layer, and (iii) being electrically isolated from those p-doped layers and active regions;

(e) for each of the LEDs of the subset, the LED including a corresponding electrically insulating layer on the p-doped layer, the corresponding one or more p-contacts extending through the electrically insulating layer to make contact with the p-doped layer; and (f) for each of the LEDs of the subset, the LED including a corresponding transparent conductive layer directly on the p-doped layer, the transparent conductive layer extending laterally from the one or more p-contacts between the p-doped layer and the electrically insulating layer over a circumscribed area of the LED and being separated from corresponding transparent conductive layers of adjacent LEDs of the subset.

2. The light-emitting device of claim 1, a nonzero combined thickness of the n-doped layer, the p-doped layer, and the active region being less than 5 μm.

3. The light-emitting device of claim 1, a nonzero spacing of the LEDs of the array being less than 200 μm.

4. The light-emitting device of claim 1, each of the n-doped layer, the p-doped layer, and the active region including one or more III-V semiconductor materials, or alloys or mixtures thereof.

5. The light-emitting device of claim 1 further comprising a wavelength-converting layer on the continuous n-doped layer and spanning the LEDs of the subset, the wavelength-converting layer being arranged to absorb at least a portion of light emitted from the active region and emitting converted light at a converted wavelength that is longer than the LED wavelength.

6. The light-emitting device of claim 5, a nonzero thickness of the wavelength-converting layer being less than 20 μm.

7. The light-emitting device of claim 1, for each of the LEDs of the subset, the corresponding one or more p-contacts including one or more metals or metal alloys.

8. The light-emitting device of claim 1, for each of the LEDs of the subset, the corresponding one or more n-contacts entirely circumscribe the p-doped layer and the active region of the LED.

9. The light-emitting device of claim 1, for each of the LEDs of the subset, the corresponding one or more n-contacts being arranged as one or more discrete, circumscribed n-contacts, so that (i) the corresponding p-doped semiconductor layers of the LEDs of the subset form a continuous p-doped layer spanning the LEDs of the subset, and (ii) the corresponding active regions of the LEDs of the subset form a continuous active region spanning the LEDs of the subset.

10. The light-emitting device of claim 1, for each of the LEDs of the subset, the one or more n-contacts including one or more metals or metal alloys.

11. The light-emitting device of claim 1 further comprising, for each of the LEDs of the subset, electrically insulating material separating the one or more n-contacts from the corresponding p-doped layer and the corresponding active region.

12. The light-emitting device of claim 1 further comprising (i) a power and control module including electronic circuitry structured and connected so as to enable selective activation of one or more LEDs of the array or one or more groups of LEDs of the array, and (ii) a circuit board or an electronic backplane, the array of LEDs being mounted onto the board or backplane so as to connect the electronic circuitry to the n-contacts and to the p-contacts.

13. A method for making a light-emitting device, the method comprising:

(A) forming on a fabrication substrate an n-doped semiconductor layer, an active region on the n-doped layer, a p-doped semiconductor layer on the active region, a transparent conductive layer directly on the p-doped layer, and an electrically insulating layer on the transparent conductive layer, the active region being arranged for emitting light at a corresponding LED wavelength as a result of radiative recombination of charge carriers at the active region;

(B) forming holes or trenches through the electrically insulating layer, the transparent conductive layer, the p-doped layer, and the active region, but not through the n-doped layer, in a pattern that defines an array of multiple LEDs in the electrically insulating layer, the transparent conductive layer, the p-doped layer, and the active region while leaving the n-doped layer as a continuous n-doped layer that spans a subset of two or more LEDs of the array;

(C) forming electrically insulating material within the holes or trenches on exposed edges of the transparent conductive layer, the p-doped layer, and the active region, and forming electrically conductive n-contacts within the holes or trenches so that the n-contacts are (i) in electrical contact with the n-doped layer at only peripheral regions of the LEDs of the subset, and (ii) electrically isolated from the transparent conductive layers, the p-doped layers and the active regions of the LEDs of the subset; and (D) forming one or more corresponding electrically conductive p-contacts on only a central region of each of the LEDs of the subset, the one or more p-contacts extending through the corresponding electrically insulating layer to make contact with the p-doped layer via the corresponding transparent conductive layer, the corresponding transparent conductive layer extending laterally from the one or more p-contacts between the p-doped layer and the electrically insulating layer over a circumscribed area of the LED and being separated from corresponding transparent conductive layers of adjacent LEDs of the subset.

14. The method of claim 13, a nonzero combined thickness of the n-doped layer, the p-doped layer, and the active region being less than 5 μm.

15. The method of claim 13 further comprising forming a wavelength-converting layer on the n-doped layer, a nonzero thickness of the wavelength-converting layer being less than 20 μm.

16. The method of claim 13 further comprising separating the n-doped layer from the fabrication substrate.

17. The method of claim 13 further comprising: (i) mounting the array of LEDs on a circuit board or on an electronic backplane; and (ii) after mounting the array of LEDs on the board or the backplane, separating the n-doped layer from the fabrication substrate, the board or the backplane connecting the n-contacts and the p-contacts to electronic circuitry of a power and control module, the circuitry being structured and connected so as to enable selective activation of one or more LEDs of the array or one or more groups of LEDs of the array.

18. A light-emitting device comprising an array of multiple semiconductor light-emitting diodes (LEDs), (a) each of the LEDs including (i) a corresponding n-doped semiconductor layer, (ii) a corresponding p-doped semiconductor layer, (iii) a corresponding active region therebetween, (iv) one or more corresponding electrically conductive n-contacts in electrical contact with the n-doped layer, and (v) one or more electrically conductive p-contacts in electrical contact with the p-doped layer, the active region being arranged for emitting light at a corresponding LED wavelength as a result of radiative recombination of charge carriers at the active region;

(b) for at least a subset of two or more LEDs of the array, the corresponding p-doped layers of the LEDs of the subset forming a continuous p-doped layer spanning the LEDs of the subset;

(c) for each of the LEDs of the subset, the corresponding one or more n-contacts being localized on the corresponding n-doped layer to only a central region of that LED and being electrically isolated from the n-contacts of adjacent LEDs of the subset;

(d) for each of the LEDs of the subset, the corresponding one or more p-contacts (i) being localized to only peripheral regions of the corresponding LEDs, (ii) extending through the n-doped layers and the active regions, but not through the continuous p-doped layer, of adjacent LEDs of the subset to make contact with the continuous p-doped layer, and (iii) being electrically isolated from those n-doped layers and active regions;

(e) for each of the LEDs of the subset, the LED including a corresponding electrically insulating layer on the n-doped layer, the corresponding one or more n-contacts extending through the electrically insulating layer to make contact with the n-doped layer; and (f) for each of the LEDs of the subset, the LED including a corresponding transparent conductive layer directly on the n-doped layer, the transparent conductive layer extending laterally from the one or more n-contacts between the n-doped layer and the electrically insulating layer over a circumscribed area of the LED and being separated from corresponding transparent conductive layers of adjacent LEDs of the subset.

* * * * *